United States Patent
Sunaga et al.

(10) Patent No.: US 7,411,993 B2
(45) Date of Patent: Aug. 12, 2008

(54) PN CODE GENERATOR, GOLD CODE GENERATOR, PN CODE DESPREADER, METHOD FOR GENERATING PN CODE, METHOD FOR GENERATING GOLD CODE, METHOD FOR DESPREADING PN CODE AND COMPUTER PROGRAM

(75) Inventors: Sumimasa Sunaga, Kawasaki (JP); Shoji Taniguchi, Kawasaki (JP); Masami Kanasugi, Kawasaki (JP); Koichi Kuroiwa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 434 days.

(21) Appl. No.: 11/103,266

(22) Filed: Apr. 11, 2005

(65) Prior Publication Data

US 2005/0190818 A1 Sep. 1, 2005

Related U.S. Application Data

(63) Continuation of application No. PCT/JP02/10576, filed on Oct. 11, 2002.

(51) Int. Cl.
*H04B 1/00* (2006.01)
*G06F 7/58* (2006.01)

(52) U.S. Cl. .................... 375/130; 375/152; 708/250

(58) Field of Classification Search ................ 375/130, 375/354, 140–50, 377; 708/100, 200, 250, 708/252, 230.232, 209, 230; 341/173; 380/268
See application file for complete search history.

(56) References Cited

U.S. PATENT DOCUMENTS 4,901,264 A 2/1990 Hayashi
5,432,815 A * 7/1995 Kang et al. ............ 375/145
5,553,076 A * 9/1996 Behtash et al. ........... 370/311
6,275,520 B1 8/2001 Nakamura et al.
6,459,722 B2 * 10/2002 Sriram et al. ............ 375/130
6,667,708 B2 * 12/2003 Schooler et al. .......... 341/173
2003/0002566 A1 * 1/2003 McDonough et al. ..... 375/147

FOREIGN PATENT DOCUMENTS

| EP | 0 301 383 | 2/1989 |
|---|---|---|
| EP | 0 938 192 | 8/1999 |
| JP | 64-36213 | 2/1989 |
| JP | 7-086982 | 3/1995 |
| JP | 7-162337 | 6/1995 |
| JP | 7-297685 | 11/1995 |
| JP | 10-11268 | 1/1998 |
| JP | 10-190524 | 7/1998 |
| JP | 10-190527 | 7/1998 |
| JP | 11-234096 | 8/1999 |
| JP | 2001-527728 | 12/2001 |
| WO | WO 99/45670 | 9/1999 |

* cited by examiner

*Primary Examiner*—Mohammad Ghayour
*Assistant Examiner*—Vineeta S Panwalkar
(74) *Attorney, Agent, or Firm*—Katten Muchin Rosenman LLP

(57) ABSTRACT

Shift code patterns at four continuous phases obtained by dividing 15 shift code patterns given to the respective flip-flops of a linear feedback shift register of degree 4 into four parts are stored in a code memory (11). Besides, mask code patterns to shift a phase of a PN code (PN) to be generated by every four phases, are stored in a code mask memory (12). Next, a logical operation is performed at a phase shift circuit (13) by using the shift code pattern outputted from the code memory (11) and the mask code pattern outputted from the code mask memory (12), to generate a PN code (PN) having a code length of 15 from a random phase.

18 Claims, 25 Drawing Sheets

FIG. 1

| PHASE | MASK CODE PATTERN | | | |
|---|---|---|---|---|
| | FF0 | FF1 | FF2 | FF3 |
| 1 | 0 | 0 | 0 | 1 |
| 2 | 0 | 0 | 1 | 0 |
| 3 | 0 | 1 | 0 | 0 |
| 4 | 1 | 0 | 0 | 0 |
| 5 | 0 | 0 | 1 | 1 |
| 6 | 0 | 1 | 1 | 0 |
| 7 | 1 | 1 | 0 | 0 |
| 8 | 1 | 0 | 1 | 1 |
| 9 | 0 | 1 | 0 | 1 |
| 10 | 1 | 0 | 1 | 0 |
| 11 | 0 | 1 | 1 | 1 |
| 12 | 1 | 1 | 1 | 0 |
| 13 | 1 | 1 | 1 | 1 |
| 14 | 1 | 1 | 0 | 1 |
| 15 | 1 | 0 | 0 | 1 |

FIG. 3A

| PHASE | CODE PATTERN | | | | |
|---|---|---|---|---|---|
| | FF0 | FF1 | FF2 | FF3 | |
| 1 | 0 | 0 | 0 | 1 | ~30a |
| 2 | 1 | 0 | 0 | 0 | ~30b |
| 3 | 0 | 1 | 0 | 0 | ~30c |
| 4 | 0 | 0 | 1 | 0 | ~30d |

| 0 | 0 | 1 | 0 | 0 | 0 | 1 |
|---|---|---|---|---|---|---|

FIG. 4

| PHASE | MASK CODE PATTERN | | | | |
|---|---|---|---|---|---|
| | FF0 | FF1 | FF2 | FF3 | |
| 1 | 0 | 0 | 0 | 1 | ~40a |
| 5 | 0 | 0 | 1 | 1 | ~40b |
| 9 | 0 | 1 | 0 | 1 | ~40c |
| 13 | 1 | 1 | 1 | 1 | ~40d |

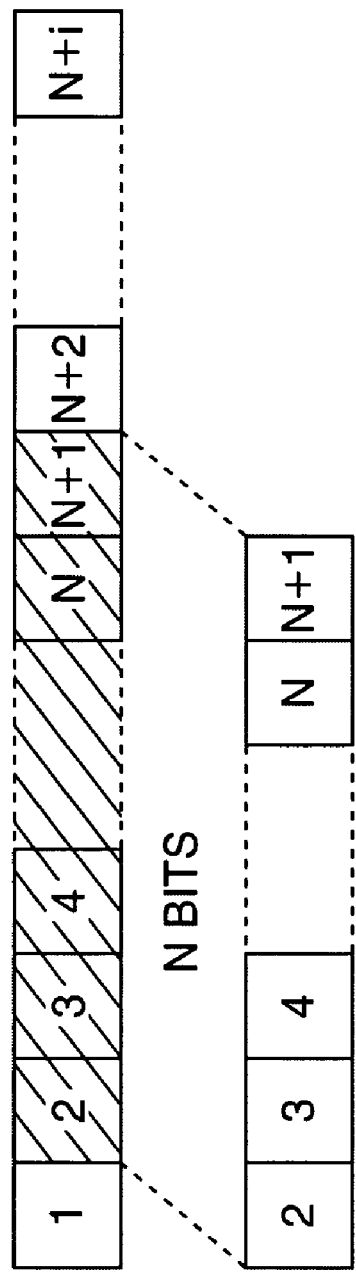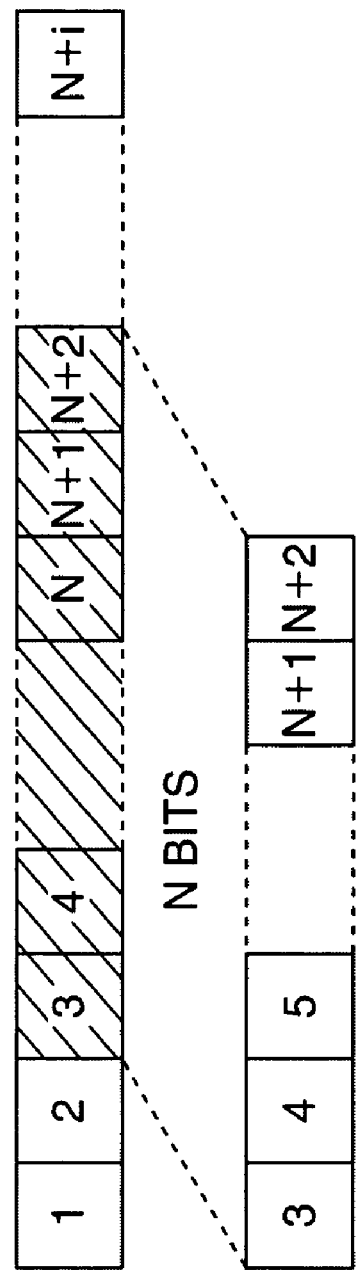

FIG. 16

| |
|---|
| L/M−3 SHIFT |
| L/M−2 SHIFT |
| L/M−1 SHIFT |
| L/M SHIFT |
| L/M+1 SHIFT |
| L/M+2 SHIFT |
| L/M+3 SHIFT |
| 2L/M−3 SHIFT |
| 2L/M−2 SHIFT |
| 2L/M−1 SHIFT |
| 2L/M SHIFT |
| 2L/M+1 SHIFT |
| 2L/M+2 SHIFT |
| 2L/M+3 SHIFT |

FIG. 24

PRIOR ART

| PHASE | CODE PATTERN | | | | OUTPUT CODE |
|---|---|---|---|---|---|
| | FF0 | FF1 | FF2 | FF3 | |
| 1 | 0 | 0 | 0 | 1 | 1 |
| 2 | 1 | 0 | 0 | 0 | 0 |
| 3 | 0 | 1 | 0 | 0 | 0 |
| 4 | 0 | 0 | 1 | 0 | 0 |
| 5 | 1 | 0 | 0 | 1 | 1 |
| 6 | 1 | 1 | 0 | 0 | 0 |
| 7 | 0 | 1 | 1 | 0 | 0 |
| 8 | 1 | 0 | 1 | 1 | 1 |
| 9 | 0 | 1 | 0 | 1 | 1 |
| 10 | 1 | 0 | 1 | 0 | 0 |
| 11 | 1 | 1 | 0 | 1 | 1 |
| 12 | 1 | 1 | 1 | 0 | 0 |
| 13 | 1 | 1 | 1 | 1 | 1 |
| 14 | 0 | 1 | 1 | 1 | 1 |
| 15 | 0 | 0 | 1 | 1 | 1 |

PN CODE GENERATOR, GOLD CODE GENERATOR, PN CODE DESPREADER, METHOD FOR GENERATING PN CODE, METHOD FOR GENERATING GOLD CODE, METHOD FOR DESPREADING PN CODE AND COMPUTER PROGRAM

CROSS-REFERENCE TO RELATED APPLICATIONS

This application is based upon and claims priority of International Patent Application No. PCT/JP2002/10576, filed on Oct. 11, 2002, the contents being incorporated herein by reference.

TECHNICAL FIELD

The present invention relates to a PN code generator, a GOLD code generator, a PN code despreader, a method for generating a PN code, a method for generating a GOLD code, a method for despreading a PN code, and a computer program, and in particular, it is suitable to be used for generating a code used in a CDMA (Code Division Multiple Access) method communication.

BACKGROUND ART

In a radio communication using a CDMA method, both a transmitting end and a receiving end use a same spread code to process a signal. Consequently, it becomes possible to transmit signals of plural channels by using a same frequency band at the same time at the transmitting end, and also, it becomes possible to extract only signals of intended channel from among the above-described plural channels at the receiving end.

By the way, as the spread code used in the CDMA method radio communication system, there is a PN code (Pseudo Random Code), or a GOLD code. Here, the GOLD code is a code sequence obtained by taking an exclusive OR of the two PN codes. Incidentally, the exclusive OR is referred to as XOR, hereinafter.

FIG. 23 is a view showing a configuration of a conventional PN code generator generating the PN code. Incidentally, in FIG. 23, the case is shown when the PN code generator is applied as a receiver to make a communication with a transmitter at a base station or the like, in the CDMA method.

In FIG. 23, a conventional PN code generator 220 is constituted by flip-flops 221a to 221d connected in series, an XOR circuit 222, and a memory 223. Incidentally, within the above, a linear feedback shift register is constituted by the flip-flops 221a to 221d and the XOR circuit 222. Besides, the PN code generator 220 having such a structure is the PN code generator of an M-sequence (Maximum-length sequence).

Operation of the conventional PN code generator 220 is described.

First, code patterns stored in the memory 223 are set to the respective flip-flops 221a to 221d, as an initial state. After that, the codes of the respective flip-flops 221a to 221c are shifted to the flip-flops 221b to 221d at the right-hand neighbor according to a clock signal CS outputted from a timer 224. At this time, the PN code PN is composed of the code outputted from the flip-flop 221d. Besides, the XOR between the code outputted from the flip-flop 221c and the code outputted from the flip-flop 221d is taken at the XOR circuit 222, and the result is outputted to the flip-flop 221a.

FIG. 24 is a view showing a state transition of the flip-flops 221a to 221d. Incidentally, in the state transition diagram of FIG. 24, FF0 to FF3 are codes given to the flip-flops 221a to 221d at the respective phases. Further, an output code is a code outputted from the flip-flop 221d at each phase, and the PN code PN is composed of this code.

As shown in FIG. 24, the code patterns of the flip-flops 221a to 221d transit sequentially from the code pattern of FF0 to FF2 are zero, and FF3 is one at a first phase to the code pattern of FF0 and FF1 are zero, and FF2 and FF3 are one at a 15th phase. Next, at a 16th phase, it goes back to the state of the first phase, and the same state transition as the state transition from the first phase is repeated from the 16th phase. Namely, in the PN code generator 220 shown in FIG. 23, the PN code PN of "100010011010111" shown by the output code in FIG. 24 is generated repeatedly, and thereby, a cyclic PN code is to be generated.

Incidentally, in a radio communication using the CDMA method, it is required to despread a received data by generating the PN code having the same time waveform as the PN code used to spread the transmission data at the transmitting end. Consequently, in a receiver using the CDMA method such as a cellular phone, the phase where the PN code used at a transmitter of a base station, and so on, starts is detected, and thereafter, the PN code PN is generated from the detected phase.

In the conventional PN code generator 220, the PN code is generated from the detected phase by the following method.

Namely, the code pattern predetermined as an initial state is set to the flip-flops 221a to 221d, and then, the PN code PN is generated after the flip-flops 221a to 221d are operated until the code pattern becomes to be the one at the detected phase.

The operation of the receiver at the time of setting the code pattern at the detected phase is described with reference to FIG. 23.

At first, a synchronous detection circuit 225 detects a beginning phase of the PN code used when the CDMA signal CD is spread, from a signal of a channel for synchronous detection contained in the CDMA signal CD received at a receiving section 226 to output to a comparator 227. Next, the comparator 227 compares the beginning phase of the PN code PN detected at the synchronous detection circuit 225 and a counted value of the timer 224, and when the both value is matched, the comparator 227 outputs an initial value load signal LS to the PN code generator 220.

The PN code generator 220, to which the initial value load signal LS is inputted, sets the code pattern corresponding to the initial value load signal LS (for example, the code pattern at the first phase in FIG. 24) to the flip-flops 221a to 221d by reading out from the memory 223, or the like. After that, the PN code generator 220 starts the operation to shift the codes given to the flip-flops 221a to 221d as stated above.

In this manner, in the conventional PN code generator 220, the predetermined code pattern is set to the flip-flops 221a to 221d, and thereafter, the codes held by the flip-flops 221a to 221d are shifted, and thereby, the code pattern at the detected phase is set.

For example, when the code pattern at a 12th phase shown in FIG. 24 is specified to set, the code pattern at the first phase is set, and then, it is required to shift the codes of the flip-flops 221a to 221d for 11 times.

In FIG. 24, a case when a degree of the linear shift register (number of the flip-flops) is four is shown, but when the degree of the linear feedback shift register is N, the respective flip-flops hold "$2^N-1$" pieces of code patterns repeatedly. The "$2^N-1$" pieces of code patterns taken by the respective flip-flops are in different states respectively, and the same state does not exist. Consequently, the codes given to the flip-flops 221a to 221d must be shifted for the number of times corresponding to the difference between the initial phase and the detected phase, to set the code pattern at the detected phase.

Generally, the degree N of the linear shift register is large (for example, 20), and therefore, the number of times to shift the codes given to the flip-flops becomes very large to obtain the code pattern at the detected phase in the above-stated manner.

As described above, it takes a vast amount of time until the code pattern at the detected phase is set by using the linear feedback shift register to generate the PN code. Namely, in the conventional PN code generator 220, it takes a long time to generate the PN code PN at a random phase.

FIG. 25 is a view showing a configuration of a conventional PN code generator to solve these problems. Incidentally, in FIG. 25, the same reference numerals and symbols are used to designate the same and corresponding elements as in FIG. 23.

In FIG. 25, a PN code generator 240 has a structure that the codes at the respective phases outputted from the flip-flop 221d of the PN code generator 220 shown in FIG. 23 (the output code shown in FIG. 24), namely, the PN code PN is stored in a memory 241 in advance. Here, the codes at the respective phases are stored at continuous addresses of the memory 241 in order.

As an explanation of the concrete operation, at first, a synchronous detection circuit 242 detects a beginning phase of the PN code used at the base station when the CDMA signal CD is spread, from a signal of a channel for synchronous detection contained in the CDMA signal CD received at the receiving section 226, and determines the beginning phase of the PN code PN to be generated at the PN code generator 240. Next, the synchronous detection circuit 242 calculates a time CT representing a timing to generate the PN code PN at the determined phase (code first time), to output to a comparator 243.

The comparator 243 is inputted the code first time CT from the synchronous detection circuit 242, and then, reads out the time counted at the timer 244, and finds a time difference between the code first time CT and the time counted at the timer 244. Next, the comparator 243 outputs an address signal AS representing an address of the memory. 241 corresponding to the calculated time difference to the memory 241. Herewith, the code stored in the address specified by the address signal AS (namely, the PN code PN at the phase detected by the synchronous detection circuit 242) is outputted from the memory 241. Next, the comparator 243 increments the converted address, and outputs the address signal AS representing the incremented address to the memory 241. Herewith, the PN code PN which begins with the code stored in the converted address is outputted from the memory 241.

As stated above, every PN code PN outputted from the linear feedback shift register is stored in the memory 241 in advance, and thereby, the PN code PN can be generated immediately from the random phase, but the number of bits to be stored in the memory 241 becomes large. When the degree of the linear feedback shift register is N, the number of bits to be stored in the memory 241 becomes "$2^N-1$". Consequently, when the PN code PN having a long code length ($=2^N-1$) is to be generated, there is a problem that the number of bits to be stored in the memory 241 becomes large.

The present invention is made in consideration with the above problems, and the object thereof is to minimize the number of bits to be stored in the memory as less as possible, and to generate the PN code immediately from the random phase.

SUMMARY OF THE INVENTION

Shift code patterns at continuous partial phases among the shift code patterns at plural phases which are given to the respective flip-flops when a linear feedback shift register is operated, are stored in a code memory, and also, mask code patterns which are partial mask code patterns among the plural mask code patterns to shift a phase of a PN code to be generated, and which shift the phase of the PN code to be generated by a multiple of a stored number of the shift code patterns at the continuous partial phases, are stored in a code mask memory. Next a logical operation is performed by using the shift code pattern and the mask code pattern, and thereby, the PN code at a random phase is generated.

In such a structure, the PN code at the random phase can be generated immediately without storing every PN code.

BRIEF DESCRIPTION OF THE DRAWINGS

FIG. 1 is a view showing a mask code pattern group corresponding to a shift code pattern of a linear feedback shift register of degree 4;

FIG. 3A and FIG. 3B are schematic diagrams showing the first embodiment of the present invention, in which contents stored in a code memory are shown;

FIG. 4 is a schematic diagram showing the first embodiment of the present invention, in which contents stored in a code mask memory are shown;

FIG. 14A and FIG. 14B are views showing the fourth embodiment of the present invention, in which operations at the time of retrieving a desired shift code pattern from code patterns stored in a code memory is explained;

FIG. 16 is a view showing the fifth embodiment of the present invention, in which storage contents of a code mask memory is explained;

FIG. 24 is a view showing the conventional art, and a state transition of flip-flops.

DETAILED DESCRIPTION OF THE PREFERRED EMBODIMENTS

Figure 2:
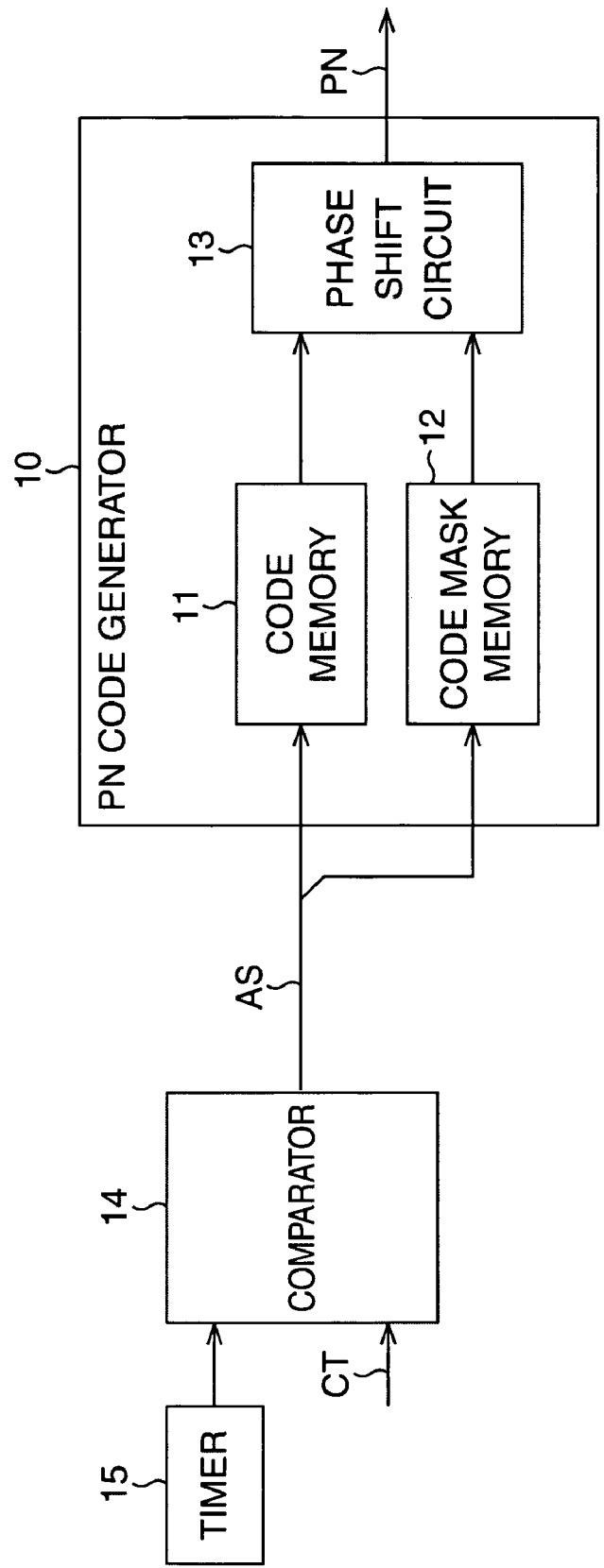
FIG. 2 is a view showing a first embodiment of the present invention, in which a schematic configuration of a PN code generator is shown.

As described later, in each embodiment of the present invention, code patterns given to the respective flip-flops of a linear feedback shift register and a code pattern of a mask code is logically operated, and thereby, a PN code is generated. Consequently, before describing about embodiments of the present invention, a method for the logical operation is explained with citing concrete examples. Incidentally, the code patterns which are given to the respective flip-flops of the linear feedback shift register are referred to as shift code patterns, and the code pattern of the mask code is referred to as a mask code pattern, hereinafter. Besides, as for the mask code, there is a description in Japanese Patent Application Laid-open No. Hei 10-190524.

FIG. 1 is a view showing the mask code patterns corresponding to the shift code patterns of the linear feedback shift register of degree 4 shown in FIG. 24.

As the logical operation, at first, a logical AND between each bit of the shift code pattern at a first phase shown in FIG. 24 and each bit of the mask code pattern at a first phase shown in FIG. 1 is taken. Concretely explaining, the logical AND between a state value zero of a least significant bit FF0 of the shift code pattern at the first phase and the state value zero of the least significant bit FF0 of the mask code pattern at the first phase is taken, and zero is calculated. Such operations are performed between the bits in the same order. An XOR of four bits code pattern (0001) obtained by these operation is taken, and thereby, an output code (PN code) of one at the first phase shown in FIG. 24 is obtained. Incidentally, the logical AND is referred to as AND, hereinafter.

In a similar manner, the above-described operation is performed by using the shift code pattern at the first phase shown in FIG. 24 and the mask code pattern at a m-th phase, and thereby, the output code (PN code) at the m-th phase can be obtained.

To generalize this, the above-described operation is performed by using the shift code pattern at a n-th phase shown in FIG. 24 and the mask code pattern at the m-th phase, and thereby, the output code (PN code) at a (n+m−1)th phase shown in FIG. 24 can be obtained. In the later-described respective embodiments, the PN code is generated by using the mask code pattern having such a property.

Hereinafter, a PN code generator, a GOLD code generator, a PN code despreader, a method for generating a PN code, a method for generating a GOLD code, a method for dispreading a PN code, and a computer program according to a first to tenth embodiments of the present invention are described with reference to the drawings.

First Embodiment

At first, a first embodiment of the present invention will be described. Incidentally, the explanation is given that a PN code generator according to the present embodiment is defined as generating a PN code by a logical operation, which is the same as the PN code generated by a PN code generator of an M-sequence (Maximum-length Sequence) constituted by a linear feedback shift register of degree 4.

Figure 5:
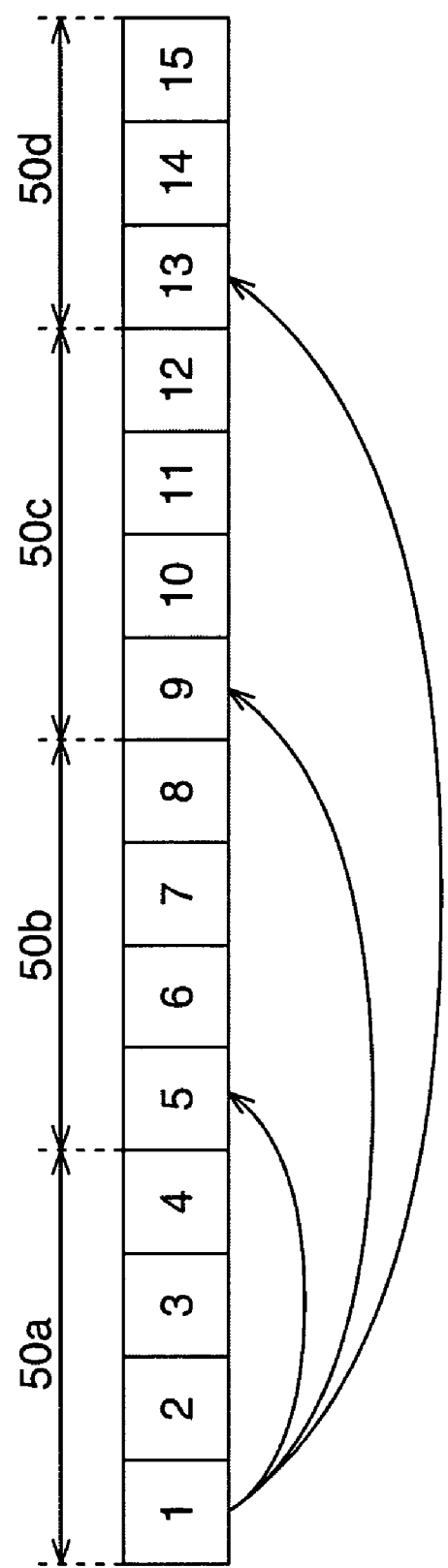
FIG. 5 is a schematic diagram showing the first embodiment of the present invention, in which a principle to generate a PN code, generated from the linear feedback shift register of degree 4, by using the PN code generator is explained.

FIG. 5 is a schematic diagram showing the first embodiment of the present invention, in which a principle to generate the PN code generated by the linear feedback shift register of degree 4, by using the PN code generator according to the present embodiment is explained.

As shown in FIG. 5, in the PN code generator according to the present embodiment, a PN code group 50a at a first to fourth phases, among the PN code having a code length of 15 generated by the linear feedback shift register of degree 4 (output code shown in FIG. 24) is generated by performing the above-described logical operation by using the shift code patterns at a first to fourth phases (shift code patterns 30a to 30d shown in FIG. 3A) and the mask code pattern to shift the phase of the PN code to be generated by zero phase (mask code pattern 40a shown in FIG. 4).

Next, as for a PN code group 50b at a fifth to eighth phases, it is generated by performing the above-described logical operation by using the shift code patterns at the first to fourth phases (shift code patterns 30a to 30d shown in FIG. 3A) and the mask code pattern to shift the phase of the PN code to be generated by four phases (mask code pattern 40b shown in FIG. 4).

Further, as for a PN code group 50c at a ninth to 12th phases, it is generated by performing the above-described logical operation by using the shift code patterns at the first to fourth phases (shift code patterns 30a to 30d shown in FIG. 3A) and the mask code pattern to shift the phase of the PN code to be generated by eight phases (mask code pattern 40c shown in FIG. 4).

Furthermore, as for a PN code group 50d at a 13th to 15th phases, it is generated by performing the above-described logical operation by using the shift code patterns at the first to fourth phases (shift code patterns 30a to 30d shown in FIG. 3A) and the mask code pattern to shift the phase of the PN code to be generated by 12 phases (mask code pattern 40d shown in FIG. 4).

As described above, in the PN code generator according to the present embodiment, every PN code having the code length of 15 generated from the linear feedback shift register of degree 4 is generated by using the shift code pattern at the first to fourth phases obtained by dividing the 15 shift code patterns shown in FIG. 24 into four parts, and the mask code patterns to shift the phase of the PN code to be generated by zero phase, four phases, eight phases, and 12 phases. Namely, in the present embodiment, only the contents of the shift code patterns 30a to 30d shown in FIG. 3A, and the mask code patterns 40a to 40d shown in FIG. 4 are stored, and thereby, every PN code having the code length of 15, generated from the linear feedback shift register of degree 4 can be generated, without storing all of the shift code patterns shown in FIG. 24 and the mask code patterns shown in FIG. 1. Hereinafter, a concrete configuration of the PN code generator according to the present embodiment will be explained.

FIG. 2 is a view showing the first embodiment of the present invention, in which a schematic configuration of the PN code generator is shown.

In FIG. 2, a PN code generator 10 has a code memory 11, a code mask memory 12, and a phase shift circuit 13.

The code memory 11 and the code mask memory 12 are storage media such as a RAM.

Contents to be stored in the code memory 11 are described.

FIG. 3A and FIG. 3B are schematic diagrams showing the first embodiment of the present invention, in which the contents stored in the code memory 11 are shown.

As shown in FIG. 3A, in the code memory 11, for example, the contents of the shift code patterns 30a to 30d at the first to fourth phases among the shift code patterns at the continuous phases obtained by dividing the 15 shift code patterns shown in FIG. 24 into four parts, are stored.

However, in the present embodiment, the shift code patterns at the first to fourth phases are not stored in the code memory 11 as they are. Concretely explaining, as shown in FIG. 3B, a code of three bits are stored in the code memory 11 following to the least significant bit of the shift code pattern at the first phase (a bit of FF0), and thereby, the shift code patterns at the first to fourth phases can be obtained.

Namely, when the bits from the most significant (rightmost) bit to the fourth bit of the code pattern 31 are specified, the shift code pattern at the first phase shown in FIG. 3A can be obtained. When the bits from the second bit to the fifth bit of the code pattern 31 are specified, the shift code pattern at the second phase can be obtained. Similarly, when the bits from the third bit to the sixth bit of the code pattern 31 are specified, the shift code pattern at the third phase, and when the bits from the fourth bit to the least significant (leftmost) bit are specified, the shift code pattern at the fourth phase can be obtained, respectively.

Next, contents to be stored in the code mask memory 12 are described.

FIG. 4 is a schematic diagram showing the contents stored in the code mask memory 12.

As shown in FIG. 4, in the code mask memory 12, mask code patterns at the first, fifth, ninth, and 13th phases among the mask code patterns at the respective phases of the mask code 10 shown in FIG. 1, are stored. Namely, as stated above, in the code mask memory 12, the mask code patterns to shift the PN code to be generated by zero phase, four phases, eight phases, and 12 phases are stored in the code mask memory 12.

Figure 25:
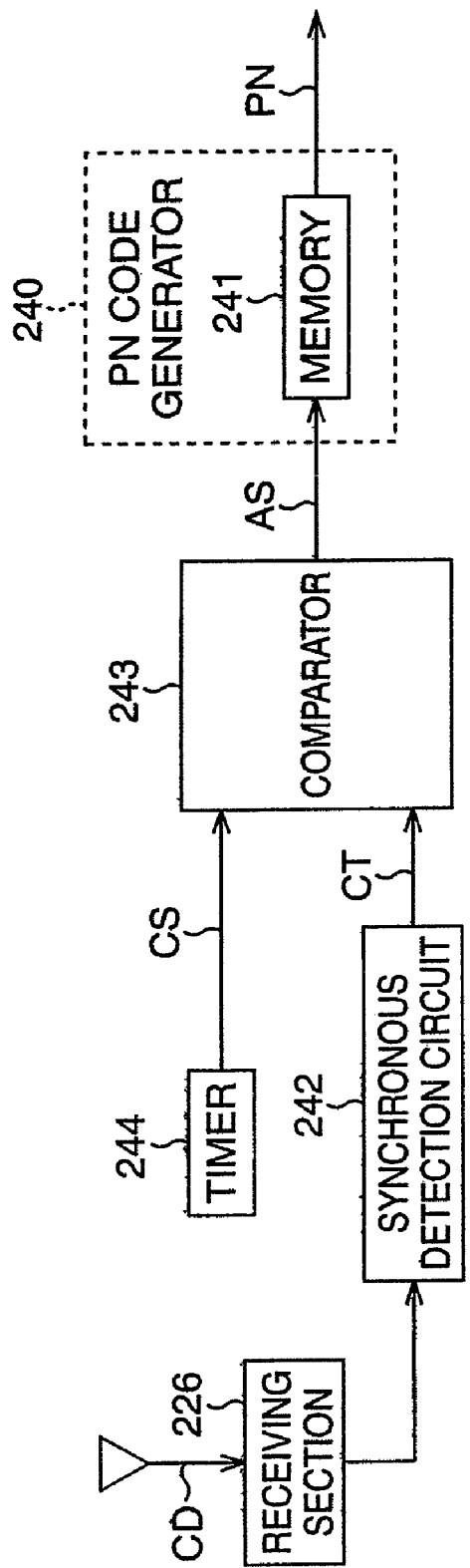
FIG. 25 is a view showing the conventional art, in which a configuration of the PN code generator is shown.

Next, the operation at the time when the shift code pattern stored in the code memory 11 and the mask code pattern stored in the code mask memory 12 are outputted is described. Incidentally, in what follows, the synchronous detection circuit 242 and the receiving section 226 are the same as those shown in FIG. 25.

The synchronous detection circuit 242 detects a beginning phase of the PN code used at a base station when a CDMA signal CD is spread, from a channel signal for the synchronous detection contained in the CDMA signal CD received at the receiving section 226, and thereby determines the beginning phase of the beginning PN code PN to be generated at the PN code generator 10. Next, the synchronous detection circuit 242 calculates a time (code first time) CT representing a timing to generate the PN code PN at the determined phase, to output to a comparator 14.

The code first time CT is inputted from the synchronous detection circuit 242, and then, the comparator 14 reads out the time counted at a timer 15, to find the time difference between the code first time CT and the time counted at the timer 15. Next, the comparator 14 outputs an address signal AS representing an address corresponding to the calculated time difference to the code memory 11 and the code mask memory 12. Concretely explaining, for example, when the time difference between the code first time CT and the time counted at the timer 15 is zero, the addresses of the code memory 11 and the code mask memory 12 are specified so as to generate the PN code at the first phase shown in FIG. 24. Further, when the time difference between the code first time CT and the time counted at the timer 15 is one, the addresses of the code memory 11 and the code mask memory 12 are specified so as to generate the PN code at the second phase shown in FIG. 24. It is the same as above, when the time difference between the code first time CT and the time counted at the timer 15 are from two to 14, the addresses of the code memory 11 and the code mask memory 12 are specified so as to generate the PN code PN at the third to 15th phases shown in FIG. 24, respectively. As stated above, in the PN code generator 10 according to the present embodiment, the addresses of the code memory 11 and the code mask memory 12 are specified, and thereby, the shift code pattern and the mask code pattern are read out, and by using the read out shift code pattern and the mask code pattern, the PN code PN having a random phase as a beginning phase is generated by performing an above-described method in FIG. 5.

The address represented by the address signal AS is, for example, an address of four bits. Lower two bits among the four bits address are assigned to the code memory 11, and upper two bits are assigned to the code mask memory 12. Namely, the lower two bits of the address are outputted to the code memory 11, and the upper two bits of the address are outputted to the code mask memory 12 among the address represented by the address signal AS.

Hereinafter, a method to specify the shift code patterns 30a to 30d and the mask code patterns 40a to 40d is described with citing concrete examples.

For example, the shift code pattern 30a shown in FIG. 3A is assigned to the lower two bits address "00", the shift code pattern 30b is assigned to the lower two bits address "01", the shift code pattern 30c is assigned to the lower two bits address "10", and the shift code pattern 30d is assigned to the lower two bits address "11", respectively. Besides, the mask code pattern 40a shown in FIG. 4 is assigned to the upper two bits address "00", the mask code pattern 40b is assigned to the upper two bits address "01", the mask code pattern 40c is assigned to the upper two bits address "10", and the mask code pattern 40d is assigned to the upper two bits address "11", respectively.

As described above, the PN code generator 10 according to the present embodiment specifies the addresses of the code memory 11 and the code mask memory 12, and thereby the PN code PN at a random phase can be generated. However, hereinafter, read out operations of the code memory 11 and the code mask memory 12, when the time difference between the code first time CT and the time counted at the timer 15 is zero (namely, when the PN code is generated from the first phase) is described.

At first, when the time difference is zero, and it is specified to generate the PN code PN of which beginning phase is the first phase shown in FIG. 24, the comparator 14 generates the address signal AS indicating the address "0000", in which the two bits address "00", representing a storage region of the shift code pattern 30a at the first phase, is the lower address, and the two bits address "00", representing the storage region of the mask code pattern 40a at the first phase (the mask code pattern to shift the PN code to be generated by zero phase), is the upper address. Herewith, the shift code pattern 30a at the first phase and the mask code pattern 40a at the first phase are outputted, and the PN code PN at the first phase is calculated by the above-stated logical operation. The PN code PN at the phase corresponding to the time difference is thus generated. As for the PN code at the phase following to the phase corresponding to the time difference, the addresses of the code memory 11 and the code mask memory 12 are specified by incrementing the address "0000" sequentially, and a cyclic PN code is generated by reading out the shift code patterns 30a to 30d and the mask code patterns 40a to 40d stored in the specified addresses as stated below.

At first, the comparator 14 increments the address "0000" to specify the address "0001", and thereby, generates the address signal AS specifying the shift code pattern 30b at the second phase and the mask code pattern 40a at the first phase. Herewith, the shift code pattern 30b at the second phase and the mask code pattern 40a at the first phase are outputted, and the PN code PN at the second phase is calculated by the above-stated logical operation.

Next, the comparator 14 increments the address "0001" to specify the address "0010", and generates the address signal AS specifying the shift code pattern 30c at the third phase and the mask code pattern 40a at the first phase. Herewith, the shift code pattern 30c at the third phase and the mask code pattern 40a at the first phase are outputted, and the PN code PN at the third phase is calculated by the above-stated logical operation.

Next, the comparator 14 increments the address "0010" to specify the address "0011", and generates the address signal AS specifying the shift code pattern 30d at the fourth phase and the mask code pattern 40a at the first phase. Herewith, the shift code pattern 30d at the fourth phase and the mask code pattern 40a at the first phase are outputted, and the PN code PN at the fourth phase is calculated by the above-stated logical operation.

Next, the comparator 14 increments the address "0011" to specify the address "0100", and generates the address signal AS specifying the shift code pattern 30a at the first phase and the mask code pattern 40b at the fifth phase. Herewith, the shift code pattern 30a at the first phase and the mask code pattern 40b at the fifth phase are outputted, and the PN code PN at the fifth phase is calculated by the above-stated logical operation.

As it is similarly for the PN codes PN at the sixth and later phases, the desired shift code pattern and mask code pattern are outputted by the address signal AS, and thereby, all of the PN codes PN at the first to 15th phases are calculated.

As stated above, in the present embodiment, the shift code patterns 30a to 30d stored in the code memory 11 and the mask code patterns 40a to 40d stored in the code mask memory 12 are specified by incrementing the four bits address. Namely, in the present embodiment, a circuit scale is reduced by enabling to specify the shift code patterns 30a to 30d stored in the code memory 11 and the mask code patterns 40a to 40d stored in the code mask memory 12 only by incrementing the address.

Figure 6:
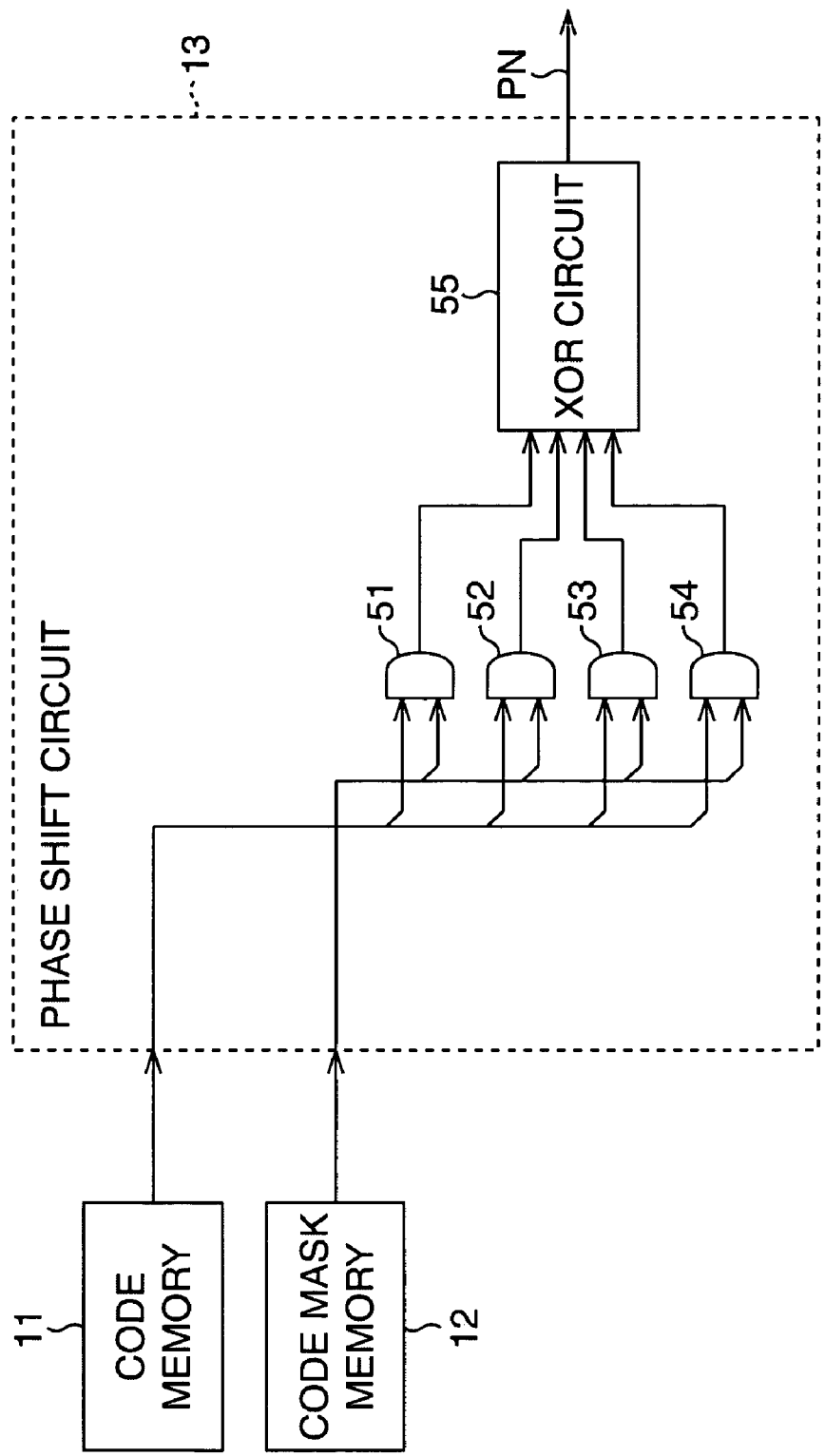
FIG. 6 is a view showing the first embodiment of the present invention, in which a schematic configuration of a phase shift circuit is shown.

FIG. 6 is a view showing the first embodiment of the present invention, in which a schematic configuration of a phase shift circuit 13 is shown.

As shown in FIG. 6, the phase shift circuit 13 has four AND circuits 51 to 54 connected in parallel, and an XOR circuit 55.

The AND circuits 51 to 54 take an AND between the bits in the same order of the shift code pattern inputted from the code memory 11 and of the mask code pattern inputted from the code mask memory 12, to output to the XOR circuit 55.

The XOR circuit 55 generates the PN code PN by taking an XOR of the four bits codes outputted from the AND circuits 51 to 54.

Next, the operation of the PN code generator 10 is described with citing the example when the PN code (output code) PN at the fifth phase shown in FIG. 24 is generated.

At first, the address signal AS to read out the shift code pattern at the first phase stored in the code memory 11, and also, to read out the mask code pattern at the fifth phase stored in the code mask memory 12 is outputted from the comparator 14 to the code memory 11 and the code mask memory 12.

Herewith, the codes of the respective bits of the shift code pattern at the first phase are outputted from the code memory 11 to the AND circuits 51 to 54. Concretely speaking, zero is outputted to the AND circuits 51 to 53, and one is outputted to the AND circuit 54.

On the other hand, the codes of the respective bits of the mask code pattern at the fifth phase are outputted from the code mask memory 12 to the AND circuits 51 to 54. Concretely speaking, zero is outputted to the AND circuits 51 and 52, and one is outputted to the AND circuits 53 and 54.

The AND circuits 51 to 54 take the AND between the inputted two codes, to output to the XOR circuit 55. Concretely speaking, the AND circuit 51 outputs zero, the AND circuit 52 outputs zero, the AND circuit 53 outputs zero, and the AND circuit 54 outputs one, to the XOR circuit 55, respectively.

The XOR circuit 55 takes the XOR of the respective bits inputted from the AND circuit 54 to make one bit code from the four bits code. Herewith, the PN code PN (output code=1) at the fifth phase shown in FIG. 24 is calculated.

As stated above, it is required to perform the above-stated operation by using the shift code pattern at the n-th phase and the mask code pattern at the m-th phase, to obtain the PN code PN at the (n+m−1)th phase shown in FIG. 24. Consequently, it is the same as the case to generate the PN code PN at the other phase shown in FIG. 24, the PN code PN at the (n+m−1)th phase cab be generated by using the shift code pattern at the n-th phase of the code memory 11 and the mask code pattern at the m-th phase of the code mask memory 12, and by performing the above-stated process at the phase shift circuit 13. By performing such an operation, the PN code PN at the random phase obtained by the PN code generator of M-sequence constituted by the linear feedback shift register of degree 4 can be obtained immediately by the logical operation.

Incidentally, as described above, in the present embodiment, the case when the shift code patterns at the first to fourth phases among the shift code patterns shown in FIG. 24 are stored in the code memory 11, and the mask code patterns at the first, fifth, ninth, and 13th phases among the mask code patterns shown in FIG. 1 are stored in the code mask memory 12, and by using these stored code patterns, the PN code PN obtained by the linear feedback shift register of degree 4 is generated from a random phase is explained as an example, but it is generalized as follows.

At first, the shift code patterns at continuous "L/M" phases, are stored in the code memory 11, which is obtained by dividing the L pieces of shift code patterns given to the respective flip-flops of the linear feedback shift register of degree N into M pieces (M is an integral number of two or larger). Incidentally, the L is a code length and represented by $(2^N-1)$. Further, the "L/M" is an integral number in which the digits after the decimal point are rounded up. In the above-described example, the number of split M is four, and "L/M=4" pieces of the shift code-patterns from the first to "L/M=4"th phases are stored.

Besides, the mask code pattern to shift the phase of the PN code PN to be generated by "Q×L/M" phases is stored in the code mask memory 12 (Q is an integral number larger than zero and smaller than (M−1)). Namely, the mask code pattern at the "Q×L/M+1)th phase is stored.

For example, when the PN code at the "2+2×L/M"-th phase is generated, the shift code patterns from the second bit to the (2+N)th bit are read out (namely, the shift code pattern at the second phase is read out) from the code memory 11. Further, the mask code pattern to shift the phase of the PN code PN to be generated by "2×L/M" phases is read out (namely, the mask code pattern at the "2×L/M+1"-th phase is read out) from the code mask memory 12. Next, the above-stated logical operation is performed at the phase shift circuit 13 by using the code patterns read out from the code memory 11 and the code mask memory 12.

The number of bits of the code memory 11 becomes "(L/M)+N−1" (refer to FIG. 3B), and the number of bits of the code mask memory 12 becomes "M×N" (refer to FIG. 4). Consequently, the number of bits of the total memory becomes as the following (expression 1).

$$\text{Number of bits} = (L/M) + N - 1 + M \times N \quad \text{(expression 1)}$$

For example, the code length L ($=2^N-1$) of the PN code generated by the linear feedback shift register of degree 18 becomes 262143, and when all of the PN codes are stored in the memory 241 as conventional way, the number of bits of the memory 241 becomes 262143. On the contrary, when the number of split M is 128, the sum of the number of bits of the code memory 11 and the number of bits of the code mask memory 12 becomes 4369 by substituting N=18, L=262143, M=128 to the (expression 1), and it becomes 1.67% of the conventional number of bits. Consequently, the number of bits to be stored in the memory of the PN code generator to generate the PN code PN from a random phase immediately, can be drastically reduced. Herewith, the circuit scale of the memory of the PN code generator can be drastically reduced.

Incidentally, in the present embodiment, the case when the PN code generator 10 is applied to the receiver making a communication using the CDMA method is explained as an example, but it goes without saying that the PN code generator 10 can also be applied to the transmitter.

Second Embodiment

Next, a second embodiment according to the present invention is described.

Figure 7:
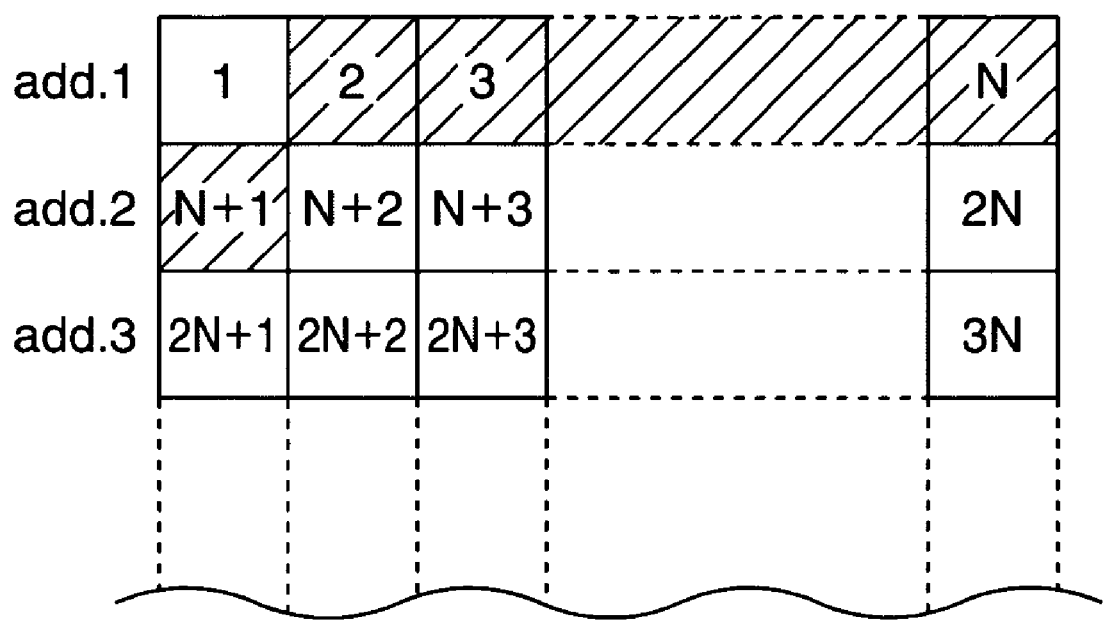
FIG. 7 is a view showing a second embodiment of the present invention, in which a bit arrangement of a code memory and a code mask memory is shown.

In the present embodiment, as shown in FIG. 7, shift code patterns to be stored in a code memory 11 and mask code patterns to be stored in a code mask memory 12 are stored in the same address by every N bits, so that the number of read out of the code pattern can be reduced. As stated above, N is a degree of a linear feedback shift register.

Figure 8:
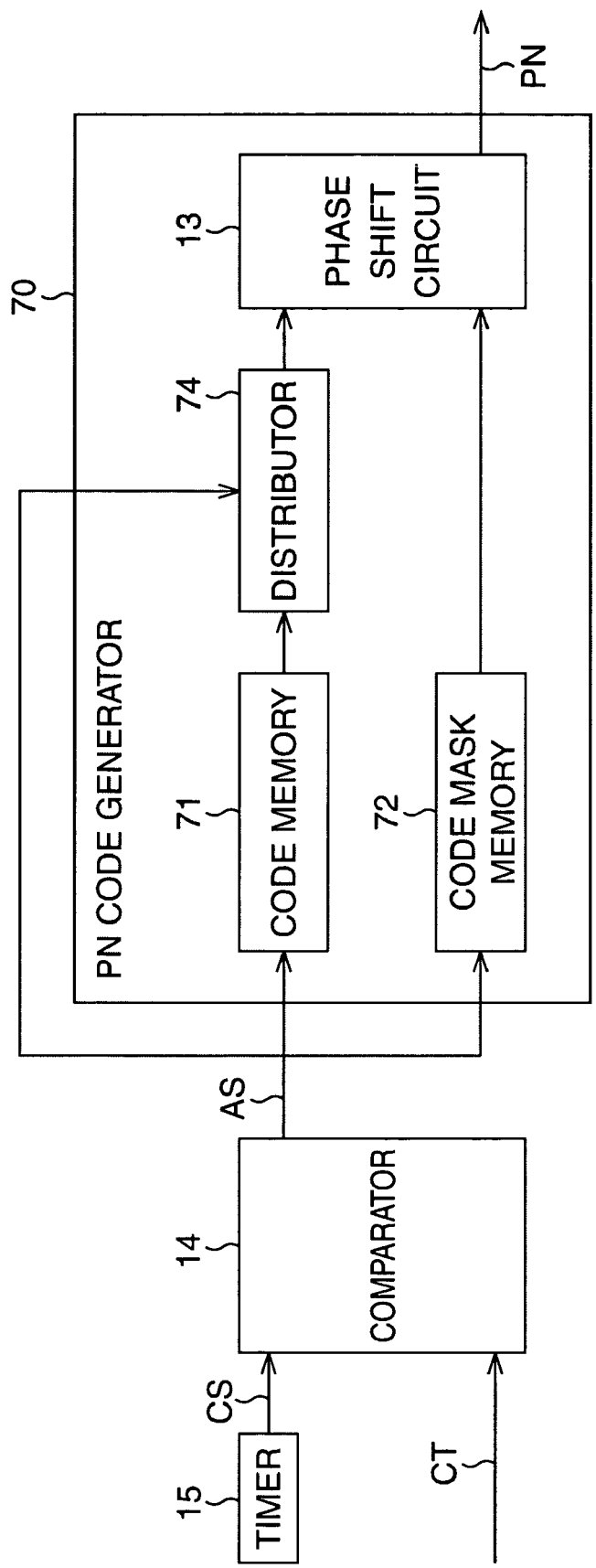
FIG. 8 is a view showing the second embodiment of the present invention, in which a schematic configuration of a PN code generator is shown.

FIG. 8 is a view showing the second embodiment of the present invention, in which a schematic configuration of a PN code generator is shown. Incidentally, in FIG. 8, the same reference numerals and symbols in FIG. 1 to FIG. 6 are used to designate the same and corresponding elements as the PN code generator 10 according to the above-described first embodiment, and the detailed description thereof will not be given.

In FIG. 8, a PN code generator 70 has a code memory 71, a code mask memory 72, the phase shift circuit 13, and a distributor 74.

As stated above, in the code memory 71, a code pattern is stored by every N bits in the same address. Besides, in the code mask memory 72, a mask code pattern is stored by every N bits in the same address. Namely, the code mask memory 72 stores the mask code pattern at the same phase in the same address.

The distributor 74 has a function to supersede the code outputted from the code memory 71 based on the address signal AS outputted from the comparator 14, to constitute the shift code pattern shown by the address signal AS, to output to the phase shift circuit 13.

For example, in FIG. 7, when the code pattern composed of the code from the second bit to the N-th bit of the first address Add1 and the first bit of the next address Add2 (shift code pattern at the second phase) is specified by the address signal AS (half-tone dot meshing portion in FIG. 7) among the code patterns stored in the code memory 71, the N bits code of the address Add1 and the N bits code of the address Add2 are outputted from the code memory 71 to the distributor 74.

The distributor 74 retrieves the shift code pattern at the second phase among the 2N bits code inputted from the code memory 71 based on the address signal AS, to output to the phase shift circuit 13.

As stated above, the desired shift code pattern is retrieved among the code outputted from the code memory 71 which stores the code pattern 31 in the same address by every N bits to give the phase shift circuit 13, and thereby, the shift code pattern at every phase can be read out by performing the read out operation once or twice.

Meanwhile, as for the code mask memory 72, if the code is stored in the same address by every N bits, it is possible to store, for example, by every mask code pattern shown in FIG. 4 in the same address, and therefore, the desired mask code pattern is outputted to the phase shift circuit 13 by performing the read out operation once.

Incidentally, as in the present embodiment, the code patterns stored in the code memory 71 and the code mask memory 72 are stored in the same address by every N bits, and thereby, it is preferable because the number of read out can be reduced as less as possible. However, the number of bits to be stored in the same addresses of the code memory 71 and the code mask memory 72 are not limited to N bits as long as the number of read out times can be reduced less than 2N times.

Moreover, it is not required to provide the distributor 74 as long as the code constituting the shift code pattern is stored in the code memory 11 so as not to be laid over plural addresses.

FIRST MODIFIED EXAMPLE

Next, a first modified example of the above-stated second embodiment is described.

In the second embodiment described above, the code patterns to be stored in the code memory 71 are stored in the same address by every N bits. In this case, when the desired shift code pattern is laid over two addresses, it is necessary to perform read out operation twice. Consequently, in the present example, the code memory 71 is divided into two parts, and the divided addresses of the respective code memories are controlled individually.

Figure 9:
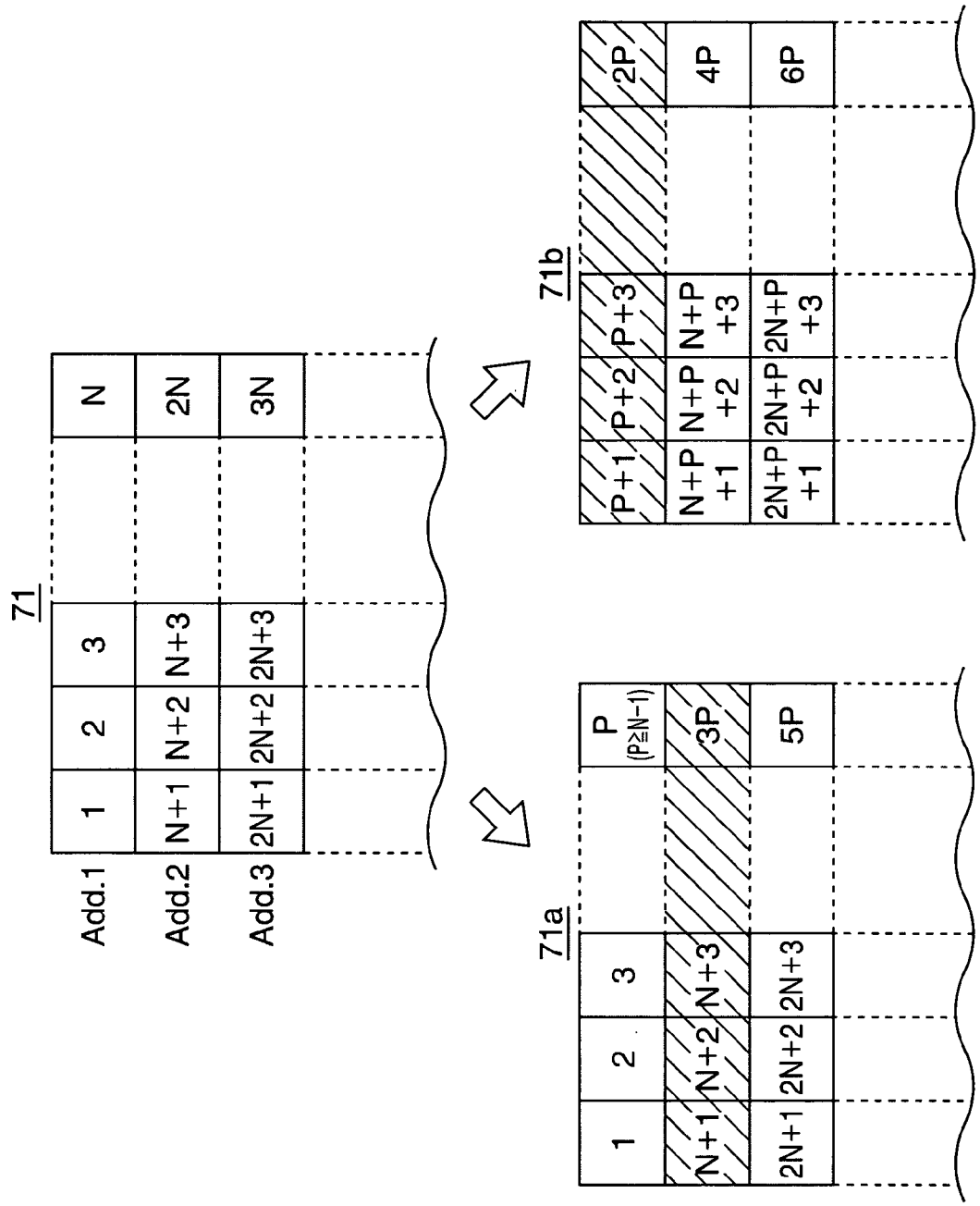
FIG. 9 is a view showing a first modified example of the present invention, in which a bit arrangement of a code memory is shown.

Concretely explaining, for example, as shown in FIG. 9, the code memory 71 is divided into two code memories 71a and 71b, so that the code pattern stored in the same address by every N bits are divided into the code pattern from the beginning bit to the P (P≧N−1)th bit, and the code pattern from the (P+1)th bit to the 2 P-th bit. Next, the addresses of the divided respective code memories 71a, 71b are specified individually, and a required code is read out from the two code memories 71a, 71b.

As for the shift code pattern which begins with a random bit (for example, a half-tone dot meshing portion in FIG. 9), it is thus possible to read out by the once read out operation, and therefore, the shift code pattern can be read out from the code memories 71a, 71b by a smaller number of read out times.

SECOND MODIFIED EXAMPLE

Next, a second modified example of the above-stated second embodiment is described.

In the above-stated second embodiment, when the desired shift code pattern is laid over two addresses as shown by the half-tone dot meshing portion in FIG. 7, the twice read out operation is necessary. Therefore, in the present example, the code pattern is stored so that the code including at least either the most significant bit or the least significant bit stored in each address is duplicated in the adjacent addresses.

Figure 10:
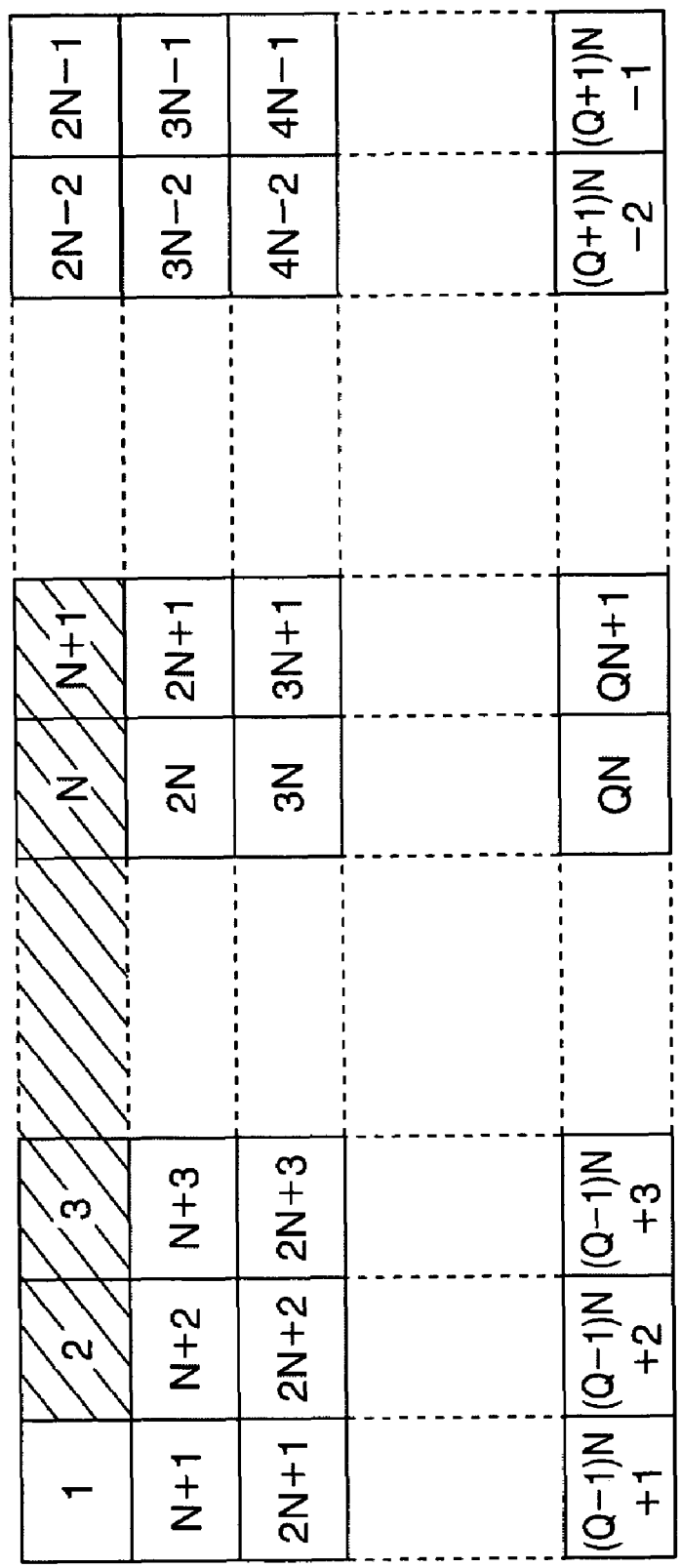
FIG. 10 is a view showing a second modified example of the present invention, in which a bit arrangement of a code memory is shown.

Concretely explaining with reference to FIG. 10, the code from the most significant bit to the (2N−1)th bit of the code pattern is stored in the first address Add1. In the next address Add2, the code from the (N+1)th bit to the (3N−1)th bit of the code pattern is stored. In the third address Add3, the code from the (2N+1)th bit to the (4N−1)th bit of the code pattern is stored. Similarly, in the Q-th address AddQ, the code from ((Q−1) N+1)th bit to ((Q+1) N−1)th bit of the code pattern is stored.

The code pattern is stored in the code memory as stated above, the shift code patterns at every phase can be read out by the once read out operation (refer to the half-dot meshing portion in FIG. 10).

A bit arrangement of the code memory is not limited to the one shown in FIG. 10 as long as the code patterns at every phase can be read out by the once read out operation.

Third Embodiment

Next, a third embodiment according to the present invention is described.

Figure 11:
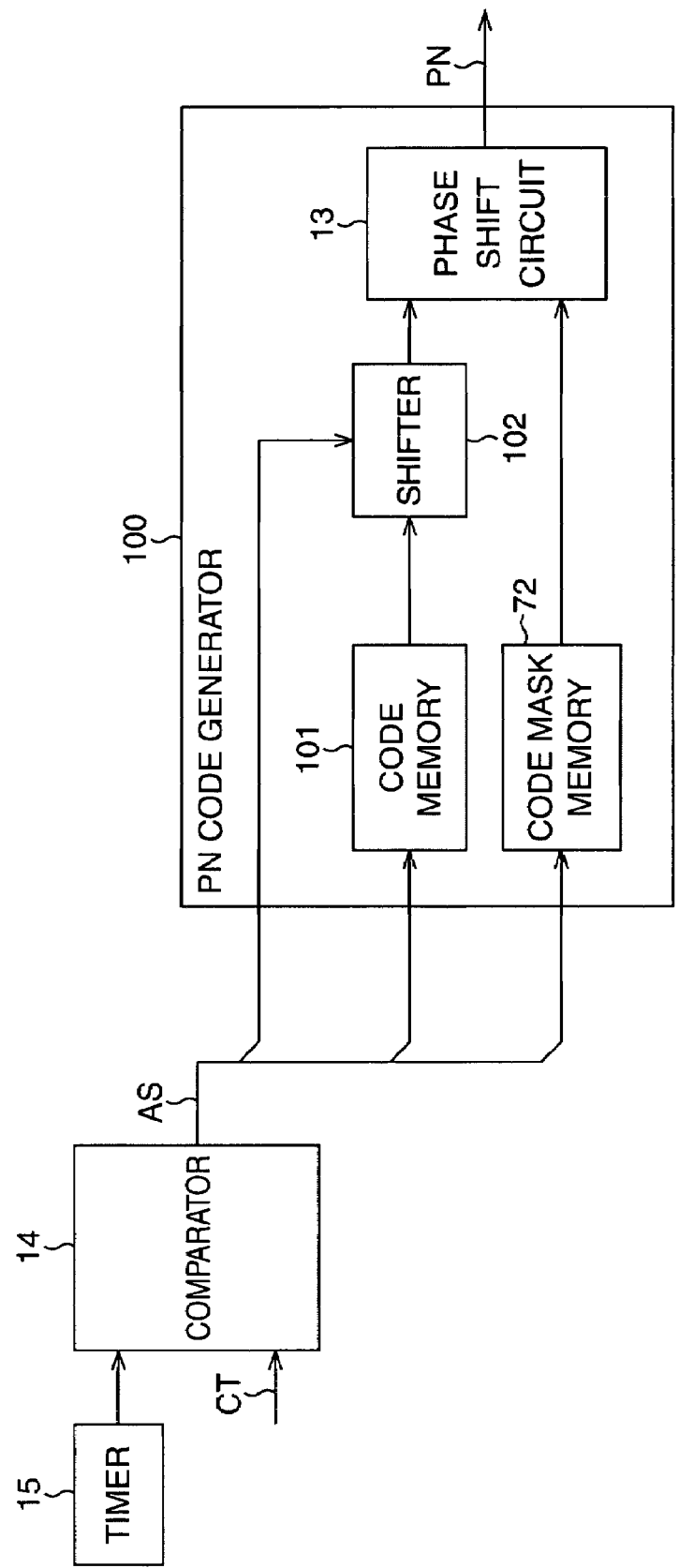
FIG. 11 is a view showing a third embodiment of the present invention, in which a schematic configuration of a PN code generator is shown.

FIG. 11 is a view showing the third embodiment of the present invention, in which a schematic configuration of a PN code generator is shown. Incidentally, in FIG. 11, the same reference numerals and symbols in FIG. 1 to FIG. 10 are used to designate the same and corresponding elements as the PN code generator 10 according to the above-described first and second embodiments, and the detailed description thereof will not be given.

In FIG. 11, a PN code generator 100 has a code memory 101, the code mask memory 72, the phase shift circuit 13, and a shifter 102.

Figure 12:
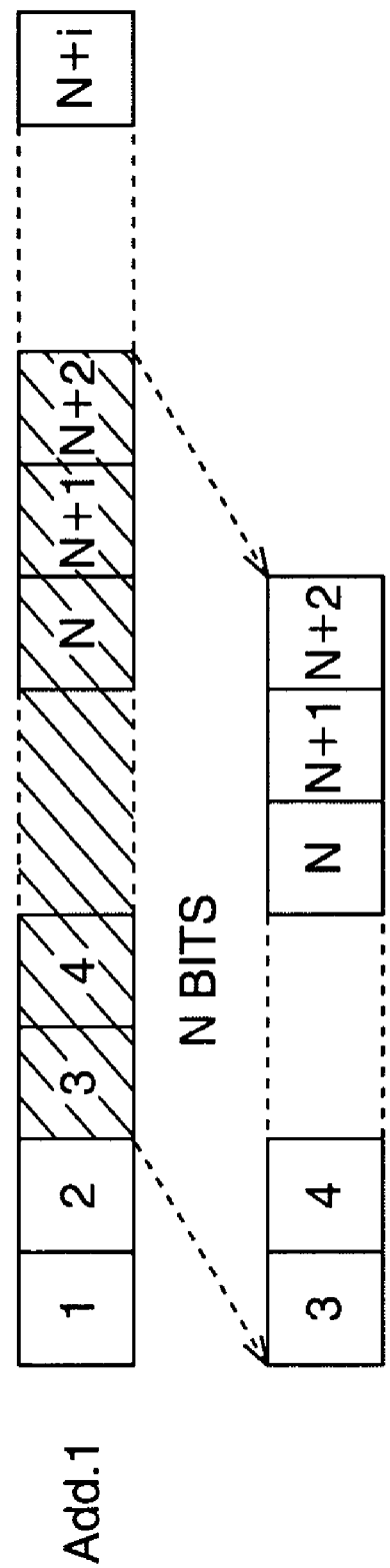
FIG. 12 is a view showing the third embodiment of the present invention, in which an operation at the time of retrieving a desired shift code pattern from code patterns stored in a code memory is explained.

FIG. 12 is a view explaining an operation at the time of retrieving a desired shift code pattern from code patterns stored in a code memory 101.

As shown in FIG. 12, the code memory 101 stores the code of (N+i) bits in the same address Add1. Here, "N" is a degree of a linear feedback shift register, and "i" is a natural number.

The shifter 102 has a function to shift the code of (N+i) bits outputted from the code memory 101, based on the address signal AS outputted from the comparator 14, to output to the phase shift circuit 13.

For example, in FIG. 12, when it is specified to retrieve the shift code pattern composed of the code from the third bit to the (N+2)th bit among the code patterns stored in the code memory 101 (shift code pattern at the third phase) by the address signal AS (a half-tone dot meshing portion in FIG. 12)the code of (N+i) bits stored in the address Add1 of the code memory 101 is outputted to the shifter 102.

Next, the shifter 102 shifts the code of (N+i) bits inputted from the code memory 101 by two bits based on the address signal AS, and retrieves the code from the third bit to the (N+2)th bit, to output to the phase shift circuit 13.

As stated above, the code pattern of the continuous N bits are retrieved from among the code of (N+i) bits outputted from the code memory 101 to output to the phase shift circuit 13 by using the shifter 102, and thereby, it becomes possible to store the code of more than N bits in one address Add1 of the code memory 101.

Fourth Embodiment

Next, a fourth embodiment of the present invention is described.

Figure 13:
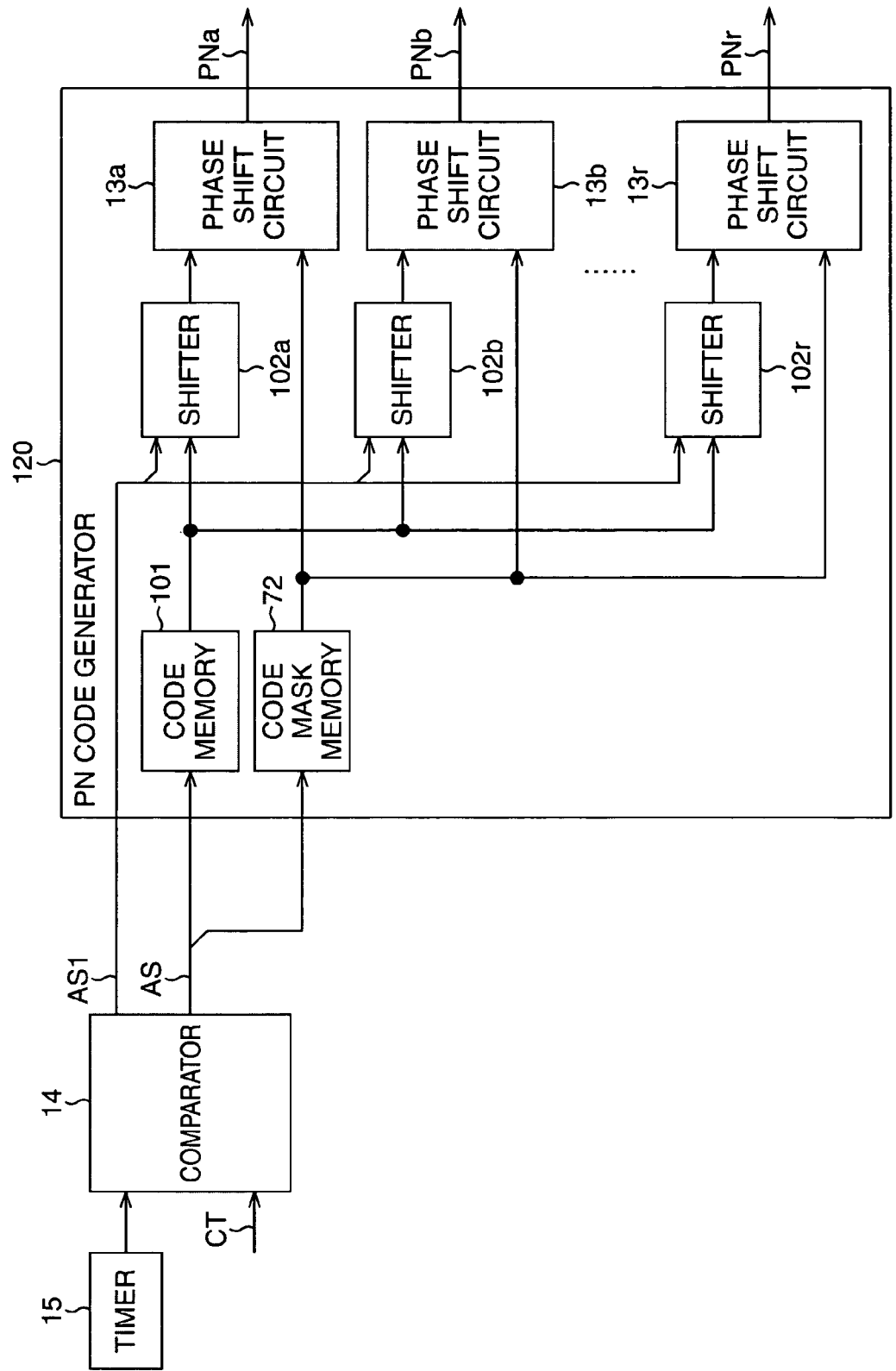
FIG. 13 is a view showing a fourth embodiment of the present invention, in which a schematic configuration of a PN code generator is shown.

FIG. 13 is a view showing the fourth embodiment of the present invention, in which a schematic configuration of a PN code generator is shown. Incidentally, in FIG. 13, the same reference numerals and symbols in FIG. 1 to FIG. 12 are used to designate the same and corresponding elements as the PN code generator according to the above-described first to third embodiments, and the detailed description thereof will not be given.

In FIG. 13, a PN code generator 120 has the code memory 101, the code mask memory 72, shifters 102a to 102r, and phase shift circuits 13a to 13r. As shown in FIG. 13, the PN code generator 120 according to the present embodiment provides a plural number of shifters 102 and phase shift circuits 13 in the PN code generator 100 of the third embodiment shown in FIG. 11, respectively, to generate PN codes PNa to PNr at continuous plural phases at the same time. A concrete operation thereof is explained with reference to FIG. 14A and FIG. 14B.

FIG. 14A and FIG. 14B are views explaining operations at the time of retrieving the desired shift code pattern from the code patterns stored in the code memory 101.

As shown in FIG. 14A, when it is specified by the address signal AS1 outputted from the comparator 14 to retrieve the shift code pattern composed of the code from the second bit to the (N+1)th bit from among the code patterns stored in the code memory 101 (shift code pattern at the second phase)the shifter 102a shifts the code pattern of (N+i) bits outputted from the code memory 101 by one bit. Herewith, the code pattern from the second bit to the (N+1)th bit (shift code pattern at the second phase) is retrieved, to output to the phase shift circuit 13a.

Next, the shifter 102b retrieves the shift code pattern at the next phase to the phase specified by an address signal AS1 outputted from the comparator 14. For example, when it is specified by the address signal AS1 to retrieve the shift code pattern at the second phase, as shown in FIG. 14B, the shifter 102b shifts the code pattern of (N+i) bits outputted from the code memory 101 by two bits to retrieve the code from the third bit to the (N+2)th bit (shift code pattern at the third phase), to output to the phase shift circuit 13b.

Similarly, the shifter 102r extracts the shift code pattern at an advanced phase specified by the address signal AS1 outputted from the comparator 14, to output to the phase shift circuit 13r.

The phase shift circuits 13a to 13r perform the logical operation described at the first embodiment by using the shift code patterns outputted from the shifters 102a to 102r and the mask code patterns outputted from the code mask memory 72. Herewith, the PN codes PNa to PNr at the continuous plural phases are generated at the same time.

As stated above, in the present embodiment, the shift code patterns of which phases are shifted one by one are outputted from the shifters 92a to 92r to the phase shift circuits 13a to 13r, and therefore, the PN codes PNa to PNr at the continuous plural phases can be generated at the same time. As a result, the PN code PN can be generated more rapidly.

Incidentally, in the above description, the example that the PN codes PNa to PNr at the continuous plural phases are generated at the same time is shown, but the shift amount of the shifters 92a to 92r may be set to a random value within the range that the code pattern read out from one address of the code memory 101 can be shifted, so that the PN codes at the random plural phases can be generated at the same time.

Fifth Embodiment

Next, a fifth embodiment of the present invention is described.

Figure 15:
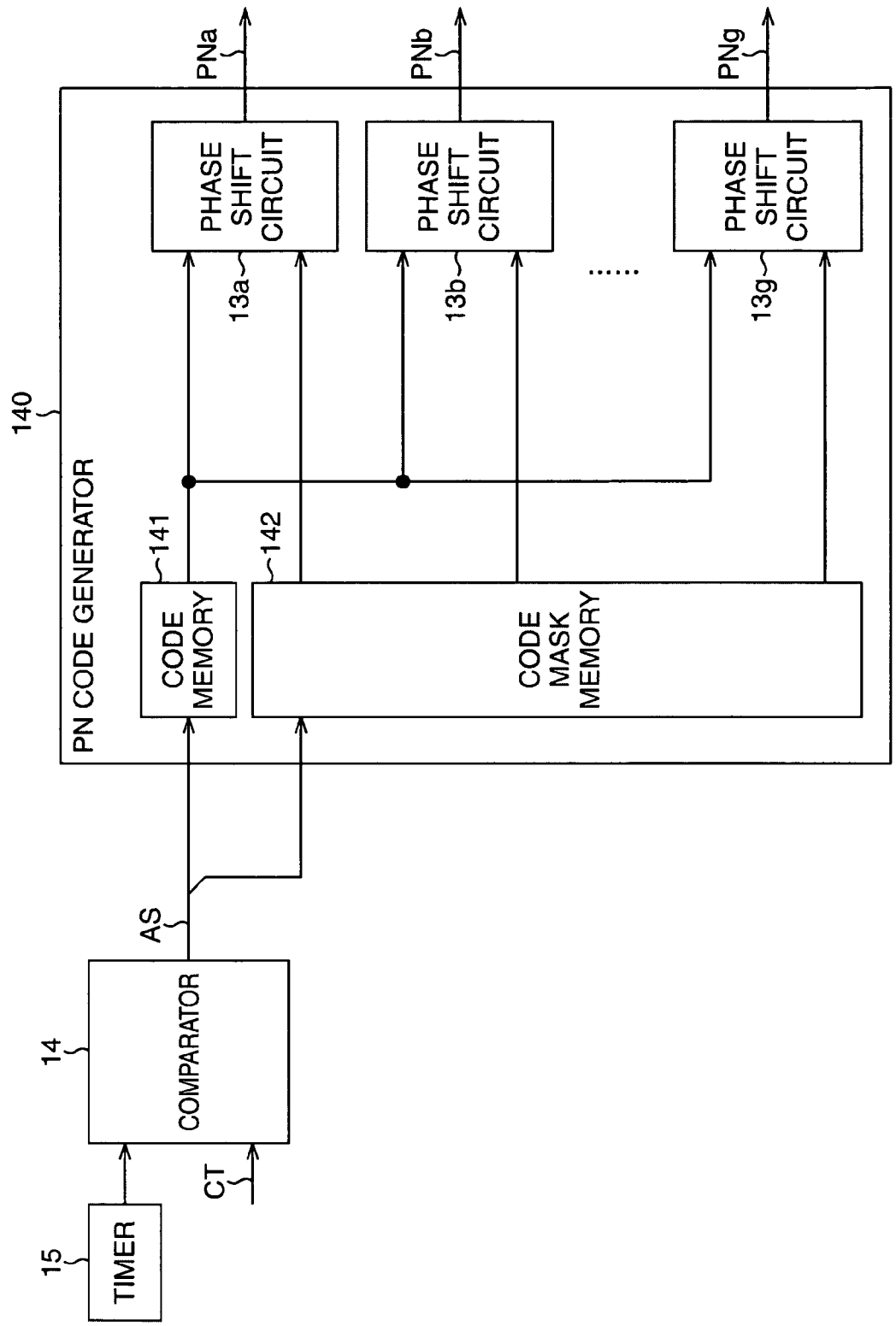
FIG. 15 is a view showing a fifth embodiment of the present invention, in which a schematic configuration of a PN code generator is shown.

FIG. 15 is a view showing the fifth embodiment of the present invention, in which a schematic configuration of a PN code generator is shown. Incidentally, in FIG. 15, the same reference numerals and symbols in FIG. 1 to FIG. 14 are used to designate the same and corresponding elements as the PN code generator according to the above-described first to fourth embodiments, and the detailed description thereof will not be given.

In FIG. 15, a PN code generator 140 has a code memory 141, a code mask memory 142, and the phase shift circuits 13a to 13g.

The code memory 141 is any one of the code memories 11, 71, and 101 explained in the above-described first to fourth embodiments.

In the code mask memory 142, the mask code pattern to shift the phase of the PN code PN to be generated by "Q×L/M" phases, and the mask code pattern to shift the phase by before and after several phases are stored. As stated above, Q is an integral number of zero or larger and "M−1" or smaller.

For example, as shown in FIG. 16, the mask code patterns to shift the phase of the PN code to be generated by "Q×L/M" phases (zero phase, L/M phases, 2×L/M phases, 3×L/M phases, . . . (M−1)×L/M phases), and the mask code patterns to shift the phase by before and after ±3 phases, are stored in the code mask memory 142.

Next, for example, when it is specified to output the mask code to shift the phase of the PN code PN to be generated by L/M phases, based on the address signal AS outputted from the comparator 14, the mask code patterns to shift the phase of the PN code PN to be generated by (L/M−3) phases, (L/M−2) phases, (L/M−1) phases, (L/M+1) phases, (L/M+2) phases, and (L/M+3) phases are outputted to the phase shift circuits 13a to 13g in addition to the mask code pattern to shift the phase of the PN code PN to be generated by L/M phases, from the code mask memory 142. At this time, for example, the mask code pattern to shift by (L/M−3) phases is outputted to the phase shift circuit 13a, the mask code pattern to shift by (L/M−2) phases is outputted to the phase shift circuit 13b, the mask code pattern to shift by (L/M−1) phases is outputted to the phase shift circuit 13c, the mask code pattern to shift by L/M phases is outputted to the phase shift circuit 13d, the mask code pattern to shift by (L/M+1) phases is outputted to the phase shift circuit 13e, the mask code pattern to shift by (L/M+2) phases is outputted to the phase shift circuit 13f, and the mask code pattern to shift by (L/M+3) phases is outputted to the phase shift circuit 13g, respectively.

The phase shift circuits 13a to 13g perform the logical operations described in the first embodiment, by using the shift code pattern outputted from the code memory 141 and the mask code pattern outputted form the code mask memory 142. Herewith, the PN codes PNa to PNg at the continuous seven phases are generated.

As stated above, in the present embodiment, the mask code pattern to shift the phase of the PN code to be generated by "Q×L/M" phases and the mask code patterns to shift the phase by before and after several phases are stored in the code mask memory 142, and when the mask code pattern to shift the phase of the PN code to be generated by "Q×L/M" phases is specified, the mask code patterns to shift the phase by before and after several phases are also outputted to the phase shift circuits 13a to 13g, and therefore, the PN codes PNa to PNg at the continuous seven (plural) phases can be generated at the same time. Herewith, the PN code PN can be generated more rapidly.

Incidentally, in the above description, the example that the PN codes PNa to PNg at the continuous plural phases are generated at the same time is shown, but the PN codes at the random plural phases may be generated at the same time by setting the mask code pattern to shift the random phases of ("Q×L/M"+I (I is a positive number)) in addition to the "Q×L/M" phases in the code mask memory 142.

Sixth Embodiment

Next, a sixth embodiment of the present invention is described.

Figure 17:
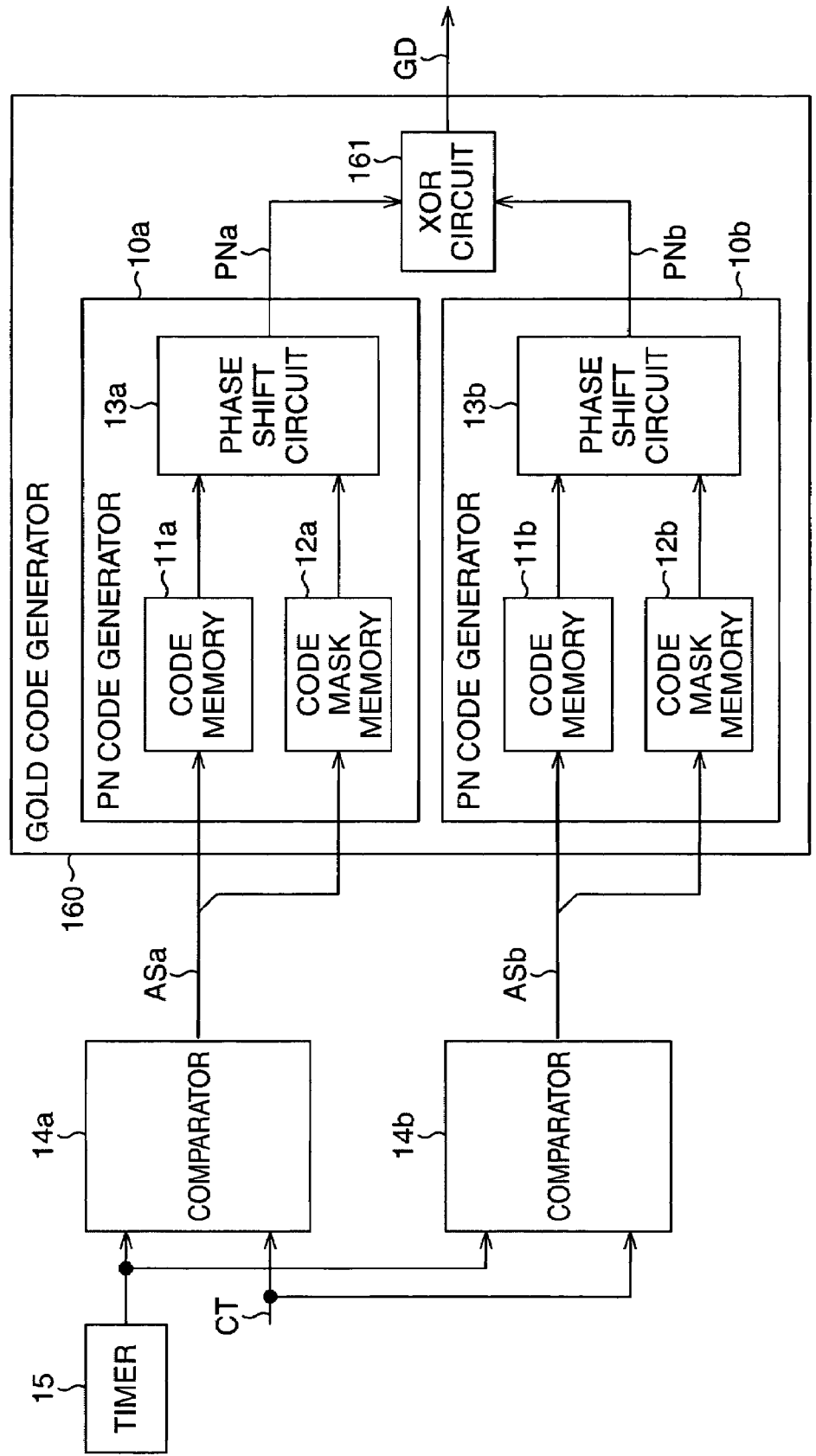
FIG. 17 is a view showing a sixth embodiment of the present invention, in which a schematic configuration of a GOLD code generator is shown.

FIG. 17 is a view showing the sixth embodiment of the present invention, in which a schematic configuration of a GOLD code generator is shown. Incidentally, in FIG. 17, the same reference numerals and symbols in FIG. 2 are used to designate the same and corresponding elements as the above-stated first embodiment, and the detailed description thereof will not be given.

In FIG. 17, a GOLD code generator 160 has code memories 11a, 11b, code mask memories 12a, 12b, two PN code generators 10a, 10b having the phase shift circuits 13a, 13b, and an XOR circuit 161.

As shown in FIG. 17, in the present embodiment, the two PN code generators 10 according to the first embodiment are provided, and an XOR of PN codes PNa, PNb generated by these are taken at the XOR circuit 161, and thereby, a GOLD code GD is to be generated.

Namely, the PN code generator 10a generates the PN code PNa as described above based on an address signal ASa from a comparator 14a, to output to the XOR circuit 161. On the other hand, the PN code generator 10b generates the PN code PNb as described above based on an address signal ASb from a comparator 14b, to output to the XOR circuit 161.

The XOR circuit 161 takes the XOR between the PN code PNa inputted from the PN code generator 10a and the PN code PNb inputted from the PN code generator 10b to generate the GOLD code GD. Incidentally, the two PN code generators 10a, 10b may have the same structure or the different structure. For example, the two PN code generators 10a, 10b may have the structures to calculate the PN codes PN generated from linear feedback shift registers of different degrees.

As stated above, in the present embodiment, the two PN code generators 10a, 10b which generate the PN codes PNa, PNb at random phases while reducing circuit scale of memories, are controlled individually by the two comparators 14a, 14b, and the XOR between the PN codes PNa and PNb generated at the respective PN code generators 10a, 10b are taken to generate the GOLD code GD. Therefore, the number of bits to be stored in the memory can be reduced as less as possible, and the GOLD code GD at the random phase can be generated immediately.

Incidentally, in the present embodiment, the case when the GOLD code is generated by using the PN code generator 10 according to the first embodiment is cited as an example, but the PN code generator applied to the GOLD code generator 160 according to the present embodiment is not limited to the PN code generator 10, and the GOLD code generator 160 may be configured by applying the PN code generator 70, 100, 120, or 140 according to the second to the fifth embodiments.

Seventh Embodiment

Next, a seventh embodiment of the present invention is described.

Figure 18:
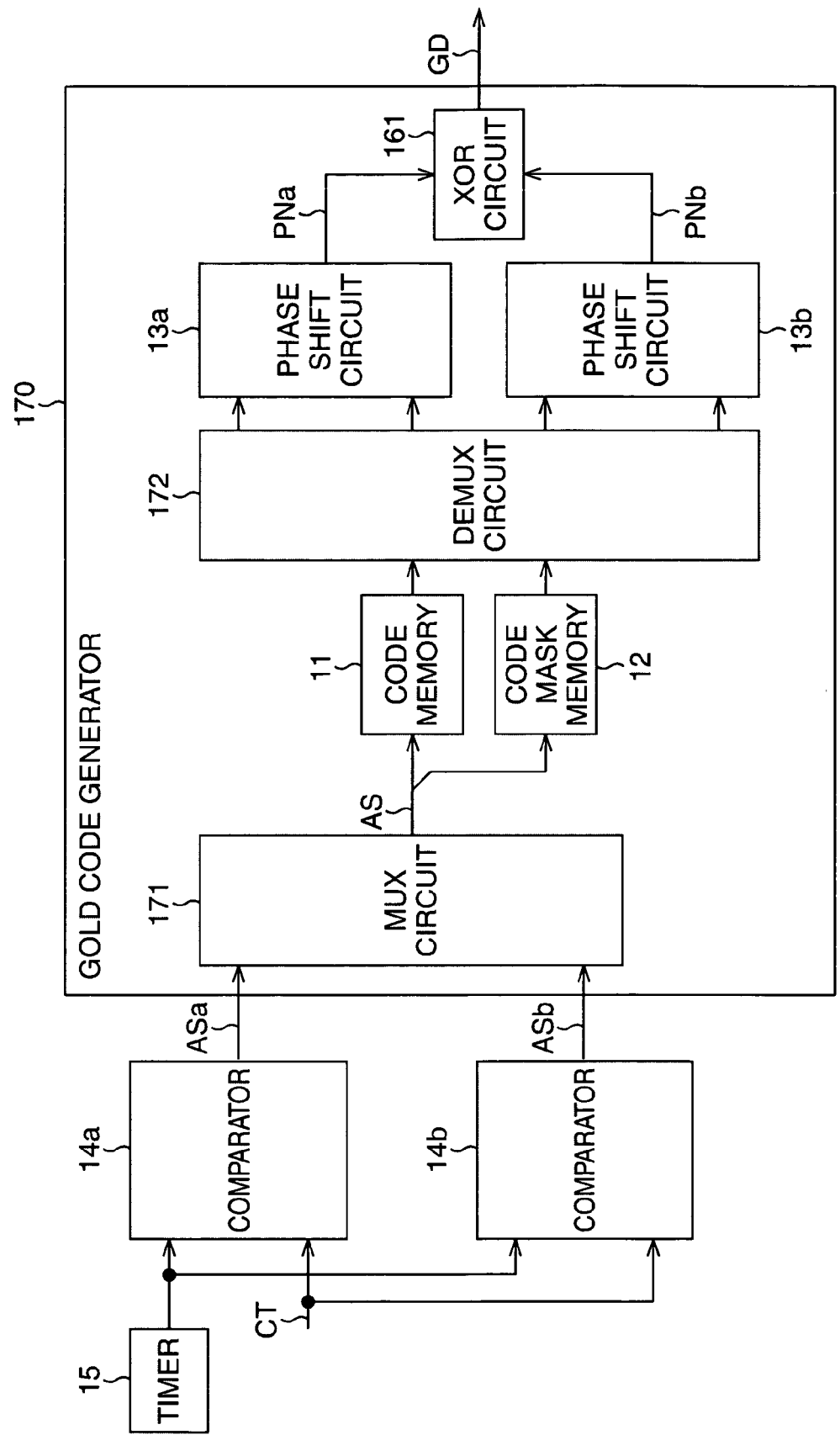
FIG. 18 is a view showing a seventh embodiment of the present invention, in which a schematic configuration of a GOLD code generator is shown.

FIG. 18 is a view showing the seventh embodiment of the present invention, in which a schematic configuration of a GOLD code generator is shown. Incidentally, in FIG. 18, the same reference numerals and symbols in FIG. 17 are used to designate the same and corresponding elements as the above-stated sixth embodiment, and the detailed description thereof will not be given.

In FIG. 18, a GOLD code generator 170 has a multiplexer circuit (MUX circuit) 171, the code memory 11, the code mask memory 12, a demultiplexer circuit (DEMUX circuit) 172, the phase shift circuits 13a, 13b, and the XOR circuit 161.

The GOLD code generator 170 according to the present embodiment generates a GOLD code GD by taking the XOR of the PN codes PNa and PNb generated from the two PN code generators in which two generation polynomials are the same.

The MUX circuit 171 outputs address signals ASa, ASb from the comparator 14a, 14b to the code memory 11 and the code mask memory 12 by time sharing. Concretely explaining, for example, the address signal ASa from the comparator 14a and the address signal ASb from the comparator 14b are outputted to the code memory 11 and the code mask memory 12 alternately.

The DEMUX circuit 172 outputs the shift code pattern outputted from the code memory 11 and the mask code pattern outputted from the code mask memory 12 to either one of the two phase shift circuits 13a, 13b, in accordance with the address signal AS from the MUX circuit 171. Incidentally, the DEMUX circuit 172 judges on which address signal ASa or ASb of the comparator 14a or 14b, the code patterns inputted from the code memory 11 and the code mask memory 12 are based, for example, based on input timings or the like of the above-stated code patterns. Next, the DEMUX circuit 172 outputs the shift code pattern and the mask code pattern inputted based on the address signal ASa from the comparator 14a, to the phase shift circuit 13a, and outputs the shift code pattern and the mask code pattern inputted based on the address signal ASb from the comparator 14b, to the phase shift circuit 13b.

The phase shift circuits 13a, 13b generate the PN codes PNa, PNb as described above by using the shift code pattern and the mask code pattern outputted from the DEMUX circuit 172.

The XOR circuit 161 takes the XOR of the PN codes PNa and PNb outputted from the phase shift circuits 13a, 13b to generate the GOLD code GD.

As stated above, in the present embodiment, when the GOLD code is generated by using the PN code generated from the two PN code generators having the same generation polynomial, the code memories 11a, 11b of the PN code generators 10a, 10b shown in FIG. 17 are held in common, and also, the code mask memories 12a, 12b are held in common, and thereby, the number of memories used when the GOLD code GD is generated can be reduced to half compared to the GOLD code generator 160 according to the sixth embodiment shown in FIG. 17. Namely, in the GOLD code generator 170 according to the present embodiment, the number of bits to be stored in the memory is more reduced, and the GOLD code at the random phase can be generated immediately.

Incidentally, in the present embodiment, the case when the code memory 11 and the code mask memory 12 in the PN code generator 10 according to the first embodiment are used is cited as an example, but the code memory and the code mask memory applied to the GOLD code generator 170 according to the present embodiment are not limited to the code memory 11 and the code mask memory 12, and the code memory 71, 101, or 141 and the code mask memory 72 or 142 according to the second to fifth embodiments are applied, and thereby, the GOLD code generator may be structured.

Eighth Embodiment

Next, an eighth embodiment according to the present invention is described.

Figure 19:
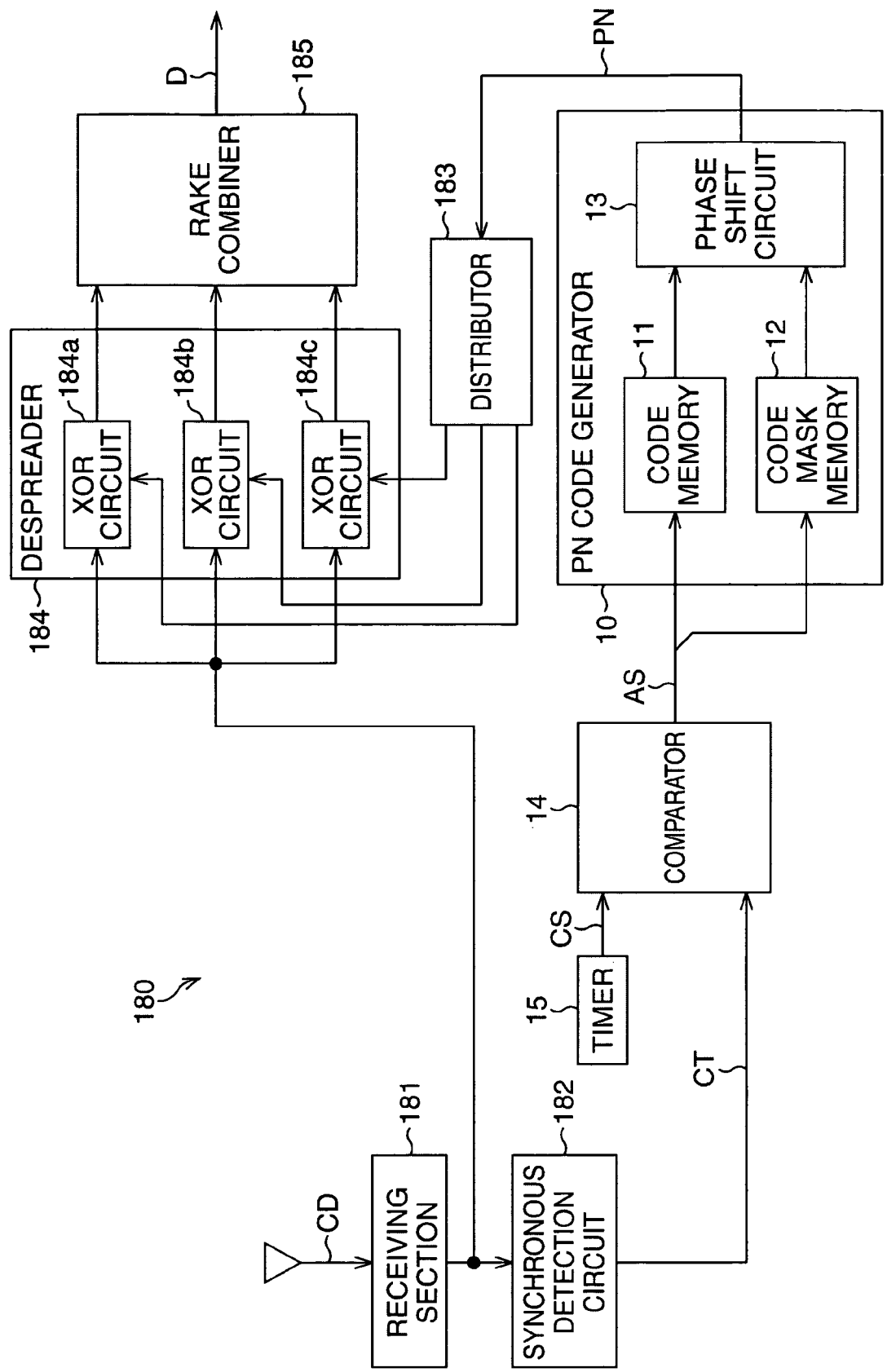
FIG. 19 is a view showing an eighth embodiment of the present invention, in which a schematic configuration of a radio communication device is shown.

FIG. 19 is a view showing the eighth embodiment of the present invention, in which a schematic configuration of a radio communication device is shown. Incidentally, in FIG. 19, the same reference numerals and symbols in FIG. 1 to FIG. 18 are used to designate the same and corresponding elements as the above-stated first to seventh embodiments, and the detailed description thereof will not be given.

In FIG. 19, a radio communication device 180 has a receiving section 181, a synchronous detection circuit 182, the timer 15, the comparator 14, the PN code generator 10, a distributor 183, a despreader 184, and a RAKE combiner 185. Incidentally, in the present embodiment, the case when the radio communication device 180 is a mobile communication terminal device to make a communication with a base station using the CDMA method is cited as an example to explain.

The receiving section 181 constituted by, for example, an antenna, an A/D converter, and so on, and has a function to receive an analog CDMA signal CD transmitted from the base station, and to generate a digital CDMA signal from the received CDMA signal CD.

Incidentally, in general, the CDMA signal CD transmitted from the base station is propagated while reflected by various obstruction such as buildings, and therefore, it is received at the receiving section 181 via plural paths. In the present embodiment, the description is made on an assumption that the signals gone through three paths are included in the CDMA signal CD.

The synchronous detection circuit 182 detects a beginning phase of a PN code used at the base station from a channel signal for synchronous detection contained in the digital CDMA signal (received data) generated at the receiving section 181, and determines the beginning phase of the PN code to be generated at the PN code generator 10. Next, the synchronous detection circuit 182 calculates a time (code first time) CT representing the timing to generate the PN code at the determined phase, and outputs to the comparator 14. At this time, the synchronous detection circuit 182 calculates the code first times CT for the respective signals of the three paths.

The comparator 14 calculates a time difference between the code first times CT for the respective signals gone through the three paths inputted from the synchronous detection circuit 182, and the time counted at the timer 15. Next, the comparator 14 generates an address signal AS corresponding to the calculated time difference as described above, to output to the code memory 11 and the code mask memory 12. Herewith, the address of the code memory 11 and the address of the code mask memory 12 to generate the PN code at the phase determined by the synchronous detection circuit 182, are specified for the respective signals which gone through the three paths.

Next, the comparator 14 generates the address signals AS to specify the address of the code memory 11 and the address of the code mask memory 12 to generate the PN code at the next phase to the phase determined by the synchronous detection circuit 182 according to the counting of the timer 15 to output to the code memory 11 and the code mask memory 12. At this time, the comparator 14 outputs the address signals AS for the respective signals gone through the tree paths to the code memory 11 and the code mask memory 12 by time sharing, so as to generate the PN code for the respective signals gone through the three paths at the same time.

The phase shift circuit 13 generates PN code PN by using the code patterns outputted from the code memory 11 and the code mask memory 12 as described above. Besides, the code patterns for the respective signals gone through the three paths are outputted by time sharing from the code memory 11 and the code mask memory 12, and therefore, the phase shift circuit 13 generates the PN codes PN for the respective signals gone through the tree paths by time sharing.

The distributor 183 outputs the PN codes PN for the respective signals of the three paths generated by the phase shift circuit 13 to the despreader 184 constituted by three XOR circuits 184a to 184c. Concretely explaining, the distributor 183 outputs the PN code PN for the signal gone through the first path among the signals gone through the three paths, to the XOR circuit 184a. Besides, the PN code PN for the signal gone through the second path is outputted to the XOR circuit 184b. Further the PN code PN for the signal gone through the third path is outputted to the XOR circuit 184c.

The XOR circuit 184a takes the XOR of the PN code PN for the signal of the first path inputted from the distributor 183 and the digital CDMA signal (received data), to output to the RAKE combiner 185. As it is the same as the XOR circuits 184b, 184c, the same process is performed as the above-described XOR circuit 184a by using the PN codes PN for the signals gone through the second and third paths and the digital CDMA signal (received data), to output to the RAKE combiner 185. As described above, the XOR of the digital CDMA signal (received data) and the PN code PN is taken, and therefore, the digital CDMA signal (received data) is despreaded.

As stated above, a PN code despreader is constituted by the PN code generator 10, the distributor 183, and the despreader 184.

The RAKE combiner 185 RAKE combines the received data despreaded by the XOR circuits 184a to 184c, to generate a compound data D. By this compound data D, images or sounds are constituted.

Figure 20:
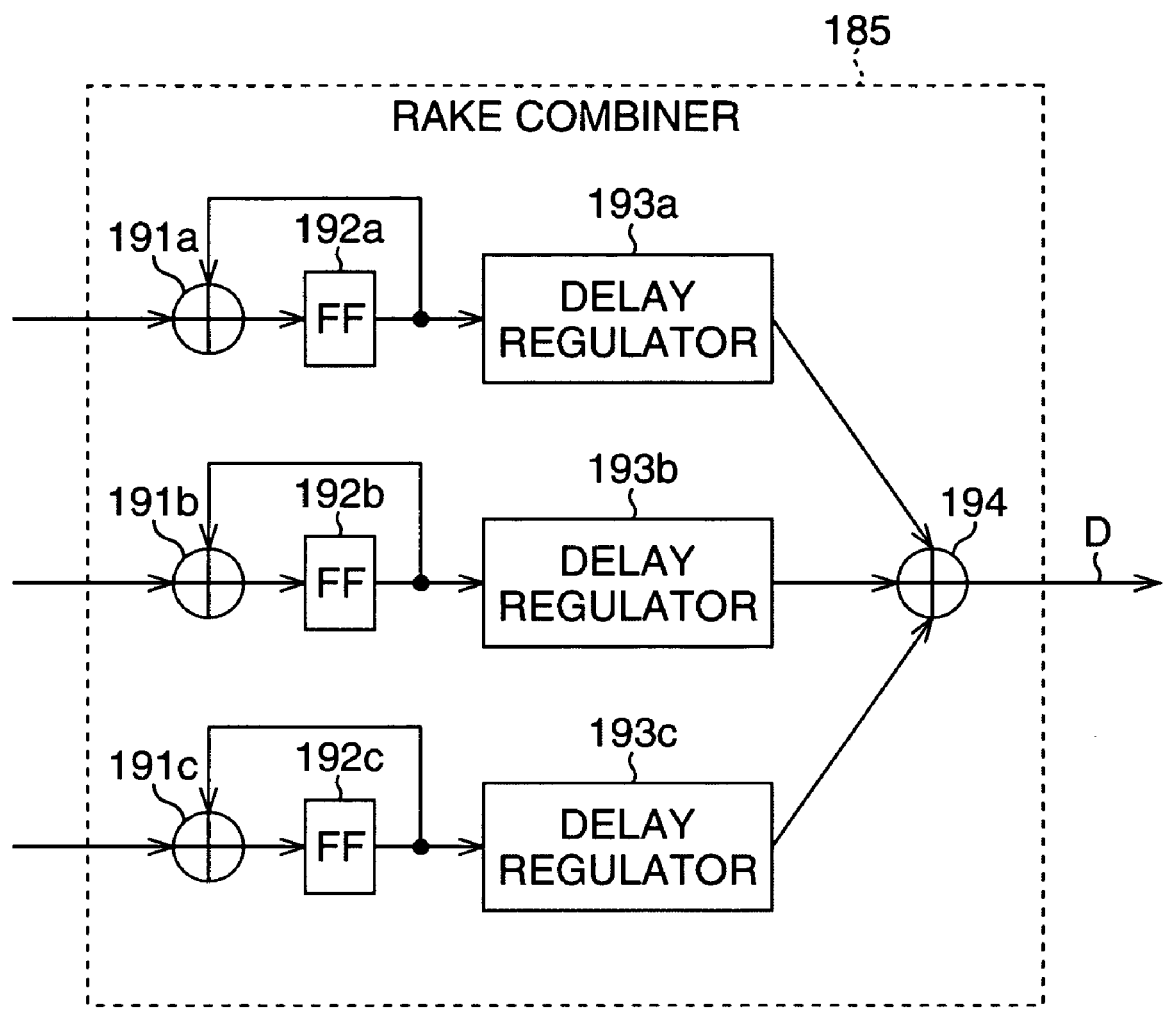
FIG. 20 is a view showing the eighth embodiment of the present invention, in which a configuration of a RAKE combiner is shown.

FIG. 20 is a view showing a configuration of the RAKE combiner 185.

In FIG. 20, the RAKE combiner 185 has adders 191a to 191c, flip-flops 192a to 192c, delay regulators 193a to 193c, and a second adder 194.

As shown in FIG. 20, in the RAKE combiner 185, at first, the received data despreaded by the XOR circuit 184a is processed by using the adder 191a and the flip-flop 192a, to output to the delay regulator 193a.

It is the same as for the received data despreaded by the XOR circuits 184b, 184c, and they are processed by using the adders 191b, 191c and the flip-flops 192b, 192c, to output to the delay regulators 193b, 193c.

The delay regulators 193a to 193c regulate the delay occurring on the received data outputted from the flip-flops 192a to 192c, and align the phases of the respective received data outputted from the flip-flops 192a to 192c, to output to the second adder 194.

The second adder 194 adds the received data outputted from the delay regulators 193a to 193c, to generate the compound data D.

As described above, in the present embodiment, the code memory 11 and the code mask memory 12 are controlled by time sharing, the PN codes PN for the respective received data received through the three paths are generated by timesharing, the generated PN codes PN are distributed to the XOR circuits 184a to 184c by using the distributor 183, and the received data are despreaded at the XOR circuits 184a to 184c. Consequently, in addition to the above-described effect of the first embodiment, there is the effect that the three PN codes PN used for dispreading the received data received through the three paths can be generated by the one PN code generator 10.

Incidentally, in the present embodiment, as the PN code generator, the PN code generator 10 according to the first embodiment is used, but the PN code generator 70, 100, 120, or 140 according to the second to fifth embodiments may be used. Further, the GOLD code generator 160 or 170 described at the sixth and seventh embodiments may be used in stead of the PN code generator.

Besides, in the present embodiment, the received data received through the three paths are described, but the number of paths is not limited to three, and any number is acceptable. In this case, the number of the XOR circuits provided at the despreader 184 is required to be corresponded to the number of paths.

Ninth Embodiment

Next, a ninth embodiment according to the present invention is described.

Figure 21:
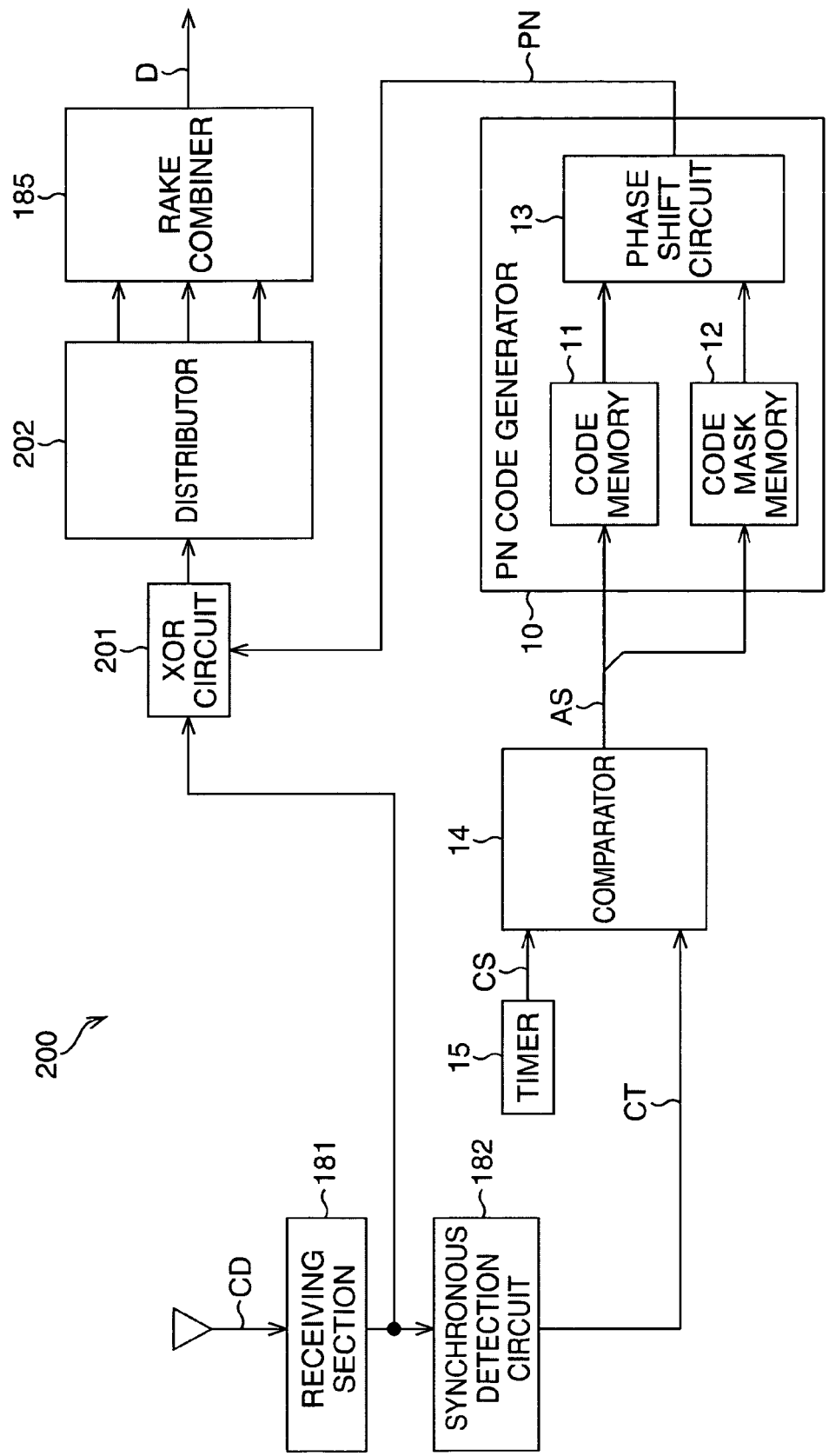
FIG. 21 is a view showing a ninth embodiment of the present invention, in which a schematic configuration of a radio communication device is shown.

FIG. 21 is a view showing the ninth embodiment of the present invention, in which a schematic configuration of a radio communication device is shown. Incidentally, in FIG. 21, the same reference numerals and symbols in FIG. 19 and FIG. 20 are used to designate the same and corresponding elements as the above-stated eighth embodiment, and the detailed description thereof will not be given.

In FIG. 21, a radio communication device (PN code despreader) 200 has the receiving section 181, the synchronous detection circuit 182, the timer 15, the comparator 14, the PN code generator 10, an XOR circuit 201, a distributor 202, and the RAKE combiner 185.

In the above-described eighth embodiment, the plural XOR circuits 184a to 184c corresponding to the number of paths are provided to despread the received data, but as shown in FIG. 21, the received data are despreaded by the one XOR circuit 201 in the present embodiment.

The XOR circuit 201 takes the XOR of the PN codes PN corresponding to the three paths outputted from the phase shift circuit 13 by time sharing and the digital CDMA signal (received data) generated at the receiving section 181, and despreads the digital CDMA signal (received data) to output to the distributor 202.

The distributor 202 has a timer, and inputs the received data despreaded at the XOR circuit 201 while monitoring the counted value of the timer. Next, the distributor 202 determines to which adders 191a to 191c of the RAKE combiner 185 (refer to FIG. 19) the inputted received data is to be outputted, based on the counted value of the timer, for example, when the received data is inputted. The distributor 202 outputs the inputted received data to the determined adders from 191*a* to 191*c*.

As described above, the PN code despreader is constituted by the PN code generator 10, the XOR circuit 201, and the distributor 202.

The RAKE combiner 185 RAKE combines the received data inputted from the distributor 202 as described above, to generates the compound data D.

As stated above, in the present embodiment, the XOR of the PN codes PN corresponding to the three paths outputted from the phase shift circuit 13 by time sharing and the received data is taken, to despread the received data, and determines to which path the despreaded received data is corresponding, by the timing when the received data is despreaded. Therefore, there is an effect that it is possible to despread the received data received through the plural paths by the one XOR circuit 201, in addition to the above-described effect in the eighth embodiment.

Incidentally, in the present embodiment, as the PN code generator, the PN code generator 10 according to the first embodiment is used, but the PN code generator 70, 100, 120, or 140 according to the second to fifth embodiments can be used. Further, the GOLD code generator 160 or 170 described in the sixth and seventh embodiments can be used in stead of the PN code generator.

Besides, in the present embodiment, the received data received through the three paths are described, but the number of paths is not limited to three, and any number is acceptable.

Tenth Embodiment

Next, a tenth embodiment according to the present invention is described.

Figure 22:
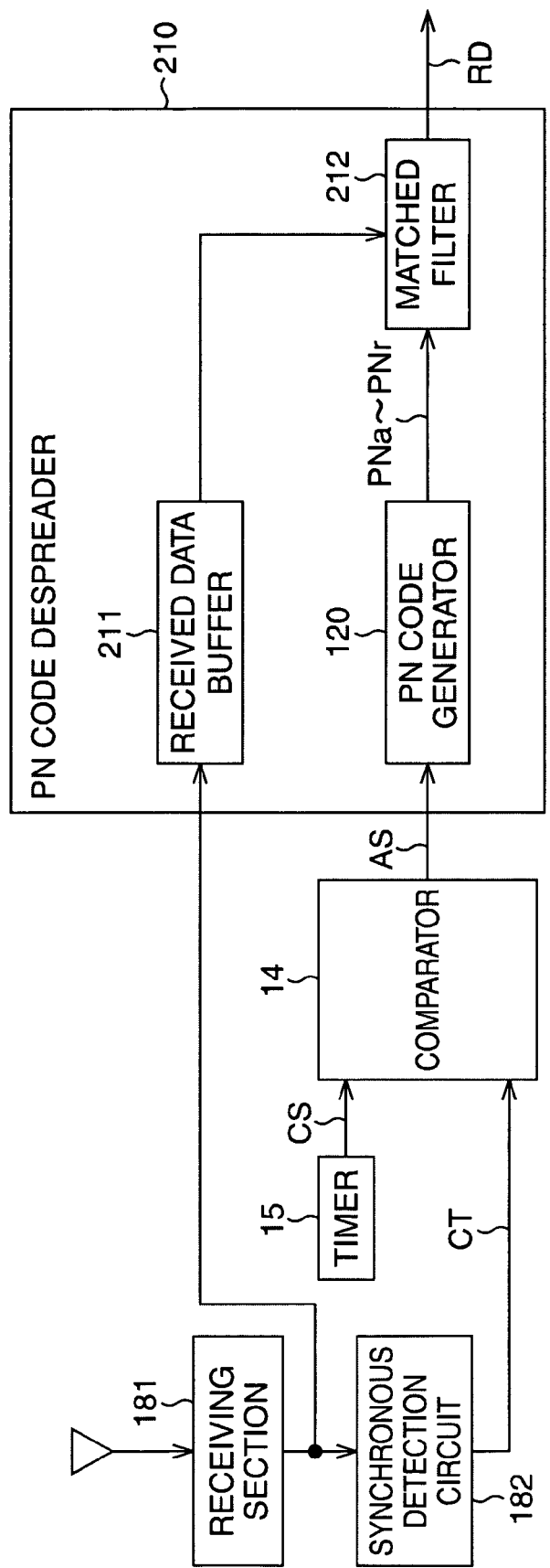
FIG. 22 is a view showing a tenth embodiment of the present invention, in which a schematic configuration of a PN code despreader is shown.
Figure 23:
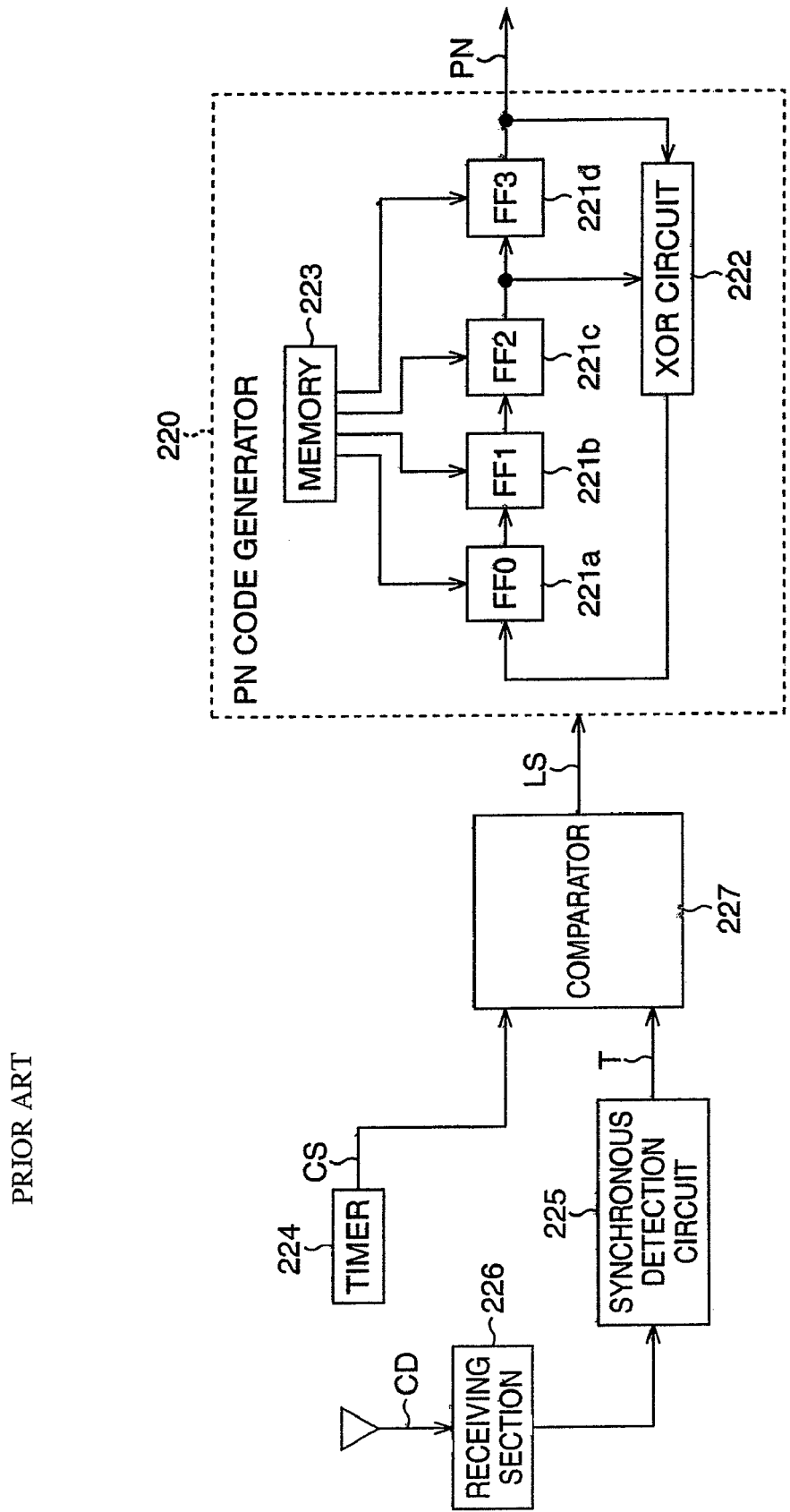
FIG. 23 is a view showing a conventional art, in which a configuration of a PN code generator is shown.

FIG. 22 is a view showing the tenth embodiment of the present invention, in which a schematic configuration of a PN code despreader is shown. Incidentally, in FIG. 22, the same reference numerals and symbols in FIG. 13 and FIG. 19 are used to designate the same and corresponding elements as the above-stated fourth and eighth embodiments, and the detailed description thereof will not be given.

In FIG. 22, a PN code despreader 210 has a received data buffer 211, the above-described PN code generator 120 according to the fourth embodiment, and a Matched filter 212.

The received data buffer 211 is a buffer storing a digital CDMA signal (received data) generated at the receiving section 181 temporary.

The PN code generator 120 has a function to generate the PN codes at the continuous plural phases at the same time as described-above.

The Matched filter 212 has functions to input the PN codes PNa to PNr at the continuous plural phases generated from the PN code generator 120 at the same time, and also, to input the received data having the same number of bits with the number of generated PN codes PNa to PNr from the received data buffer 211 to despread the received data. Herewith, a despreaded received data RD is generated.

As stated above, in the present embodiment, the received data can be despreaded at a high speed, because the PN codes at the plural phases used at the Matched filter 212 when the received data is despreaded are generated by the PN code generator 120 at the same time.

Incidentally, in the present embodiment, the case is described when the PN code generator 120 described in the fourth embodiment is used as the PN code generator, but the PN code generator applied to the present embodiment is not limited to the one according to the fourth embodiment, as long as it is a PN code generator which generates the PN codes at continuous plural phases at the same time, and for example, the PN code generator 140 described at the fifth embodiment is also acceptable.

Other Embodiments

A computer executes a program, and thereby, the first to the tenth embodiments according to the present invention can be realized. Further, a means for supplying a computer with a program, for example, a computer readable recording medium such as a CD-ROM which records such a program, or a transmission medium to transmit such a program may be applied as an embodiment. Besides, a program product of a computer readable recording medium, and so on, recording the program can also be applied as an embodiment of the present invention. The program, the computer readable recording medium, the transmission medium, and the program product are included in the range of the present invention.

Applicants describe another group of additional embodiments of the present invention:

In one embodiment of the invention, a PN code generating method is disclosed, in which a PN code is generated by using a code memory storing shift code patterns at continuous partial phases among the shift code patterns at plural phases which are given to the respective flip-flops when a liner feedback shift register is operated, and a code mask memory storing mask code patterns, which are partial mask code patterns among the plural mask code patterns to shift a phase of a PN code to be generated, and which shift the phase of the PN code to be generated by a multiple of a stored number of the shift code patterns at the continuous partial phases, said PN code generating method comprising the steps of:

a logical AND operation step to generate a new code pattern by taking a logical AND of bits in the same order of the shift code pattern stored in the code memory and the mask code pattern stored in the code mask memory; and an exclusive OR operation step to generate a PN code by taking an exclusive OR of the new code pattern generated by said logical AND operation step.

In another embodiment of the invention, a GOLD code generation method is disclosed, comprising the steps of:

a PN code generation step to generate two PN codes by using two code memories storing shift code patterns at continuous partial phases among the shift code patterns at plural phases which are given to the respective flip-flops when a liner feedback shift register is operated, and two code mask memories storing mask code patterns, which are partial mask code patterns among the plural mask code patterns to shift a phase of the PN code to be generated, and which shift the phase of the PN code to be generated by a multiple of a stored number of the shift* code patterns at the continuous partial phases; and an exclusive OR operation step to generate a GOLD code by taking an exclusive OR of the two PN codes generated by said PN code generation step, and wherein said PN code generation step includes:

a logical AND operation step to generate two new code patterns by taking a logical AND of bits in the same order of the shift code patterns stored in the two code memories and the mask code patterns stored in the two code mask memories; and a second exclusive OR operation step to generate a PN code by taking the exclusive OR of the new code pattern generated by the logical AND operation step.

In yet another embodiment of the invention, a GOLD code generation method is disclosed, comprising the steps of:

a PN code generation step to generate two PN codes by using a code memory storing shift code patterns at continuous partial phases among the shift code patterns at plural phases which are given to the respective flip-flops when a liner feedback shift register is operated, and a code mask memory storing mask code patterns, which are partial mask code patterns among the plural mask code patterns to shift a phase of a PN code to be generated, and which shift the phase of the PN code to be generated by a multiple of a stored number of the shift code patterns at the continuous partial phases; and an exclusive OR operation step to generate a GOLD code by taking an exclusive OR of the two PN codes generated by said PN code generation step, and wherein said PN code generation step includes: a logical AND operation step to generate two new code patterns by time sharing, by taking a logical AND of bits in the same order of the shift code pattern stored in the code memory and the mask code pattern stored in the code mask memory; and a second exclusive OR operation step to generate the two PN codes by time sharing, by taking the exclusive OR of the respective two new code patterns generated by the logical AND operation step by time sharing.

In still another embodiment of the invention, a PN code dispreading method is disclosed, comprising the steps of:

a PN code generation step to generate a PN code by using a code memory storing shift code patterns at continuous partial phases among the shift code patterns at plural phases which are given to the respective flip-flops when a liner feedback shift register is operated, and a code mask memory storing mask code patterns, which are partial mask code patterns among the plural mask code patterns to shift a phase of the PN code to be generated, and which shift the phase of the PN code to be generated by a multiple of a stored number of the shift code patterns at the continuous partial phases; and an exclusive OR operation step to despread a received data by taking an exclusive OR of the PN code generated by said PN code generation step and the received data, and wherein said PN code generation step includes:

a logical AND operation step to generate a new code pattern by taking a logical AND of bits in the same order of the shift code pattern stored in the code memory and the mask code pattern stored in the code mask memory; and a second exclusive OR operation step to generate the PN code by taking the exclusive OR of the new code pattern generated by the logical AND operation step.

Applicants describe yet another group of embodiments of the present invention:

In one embodiment of the invention, a computer program product is disclosed for generating a PN code by using a code memory storing shift code patterns at continuous partial phases among the shift code patterns at the plural phases which are given to the respective flip-flops when a liner feedback shift register is operated, and a code mask memory storing mask code patterns, which are partial mask code patterns among the plural mask code patterns to shift a phase of a PN code to be generated, and which shift the phase of the PN code to be generated by a multiple of a stored number of the shift code patterns at the continuous partial phases, comprising the steps of:

a logical AND operation step to generate the new code pattern by taking a logical AND of bits in the same order of the shift code pattern stored in the code memory, and the mask code pattern stored in the code mask memory; and an exclusive OR operation step to generate a PN code by taking an exclusive OR of the new code pattern generated by said logical AND operation step.

In another embodiment of the invention, a computer program product is disclosed, comprising the steps of:

a PN code generation step to generate two PN codes by using two code memories storing shift code patterns at continuous partial phases among the shift code patterns at plural phases which are given to the respective flip-flops when a liner feedback shift register is operated, and two code mask memories storing mask code patterns, which are partial mask code patterns among the plural mask code patterns to shift a phase of the PN code to be generated, and which shift the phase of the PN code to be generated by a multiple of a stored number of the shift code patterns at the continuous partial phases; and an exclusive OR operation step to generate a GOLD code by taking an exclusive OR of the two PN codes generated by said PN code generation step, wherein said PN code generation step includes:

a logical AND operation step to generate two new code patterns by taking a logical AND of bits in the same order between the shift code patterns stored in the two code memories and the mast: code patterns stored in the two code mask memories; and a second exclusive OR operation step to generate a PN code by taking an exclusive OR of the new code pattern generated by the logical AND operation step.

In yet another embodiment of the invention, a computer program product is disclosed, comprising the steps of:

a PN code generation step to generate two PN codes by using a code memory storing shift code patterns at continuous partial phases among the shift code patterns at plural phases which are given to the respective flip-flops when a liner feedback shift register is operated, and a code mask memory storing mask code patterns, which are partial mask code patterns among the plural mask code patterns to shift a phase of a PN code to be generated, and which shift the phase of the PN code to be generated by a multiple of a stored number of the shift code patterns at the continuous partial phases; and an exclusive OR operation step to generate a GOLD code by taking an exclusive OR of the two PN codes generated by said PN code generation step, wherein said PN code generation step including the steps of:

a logical AND operation step to generate two new code patterns by time sharing, by taking a logical AND of bits in the same order of the shift code pattern stored in the code memory and the mask code pattern stored in the code mask memory; and a second exclusive OR operation step to generate the two PN codes by time sharing, by taking the exclusive OR of the respective two new code patterns generated by the logical AND operation step by time sharing.

In still another embodiment of the invention, a computer program product is disclosed, comprising the steps of:

a PN code generation step to generate a PN code by using a code memory storing shift code patterns at continuous partial phases among the shift code patterns at plural phases which are given to the respective flip-flops when a liner feedback shift register is operated, and a code mask memory storing mask code patterns, which are partial mask code patterns among the plural mask code patterns to shift a phase of a PN code to be generated, and which shift the phase of the PN code to be generated by a multiple of a stored number of the shift code patterns at the continuous partial phases; and an exclusive OR operation step to despread a received data by taking an exclusive OR between the PN code generated by said PN code generation step and the received data, wherein said PN code generation step including the steps of:

a logical AND operation step to generate a new code pattern by taking a logical AND of bits in the same order between the shift code pattern stored in the code memory and the mask code pattern stored in the code mask memory; and a second exclusive OR operation step to generate the PN code by taking the exclusive OR of the new code pattern generated by the logical AND operation step.

INDUSTRIAL APPLICABILITY

As described above, according to the present invention, shift code patterns at continuous partial phases among the shift code patterns at plural phases which are given to the respective flip-flops when a linear feedback shift register is operated, are stored in a code memory, and mask code patterns to shift a phase of a PN code to be generated by a multiple of a stored number of the shift code patterns at the continuous partial phases, are stored in a code mask memory. Then, the logical AND of bits in the same order of the stored shift code pattern and mask code pattern is taken, to generate a new code pattern, and then, the exclusive OR of the generated new code pattern is taken, to generate the PN code. Therefore, the number of bits to be stored in a memory of a PN code generator so as to generate the PN code at a random phase immediately, can be reduced as less as possible. Herewith, a circuit scale of the memory of the PN code generator can be drastically reduced.

What is claimed is:

1. A PN code generator, comprising:
a code memory storing shift code patterns at continuous partial phases among the shift code patterns at plural phases which are given to the respective flip-flops when a linear feedback shift register is operated;
a code mask memory storing mask code patterns, which are partial mask code patterns among the plural mask code patterns to shift a phase of a PN code to be generated, and which shift the phase of the PN code by a multiple of a stored number of the shift code patterns at the continuous partial phases;
a logical AND operation circuit generating a new code pattern by taking a logical AND between bits in the same order of the shift code pattern stored in said code memory, and the mask code pattern stored in said code mask memory; and
an exclusive OR operation circuit generating the PN code by taking an exclusive OR of the new code pattern generated by said logical AND operation circuit.

2. The PN code generator according to claim 1,
wherein said code memory stores a code of one bit or more following to the shift code pattern at one phase among the continuous partial phases.

3. The PN code generator according to claim 2,
wherein said code memory stores the continuous two or more bits in the same address among the plural bits composing the shift code patterns at the continuous partial phases.

4. The PN code generator according to claim 2,
wherein said code memories are provided in plural, and said logical AND operation circuit generates a new code pattern by taking a logical AND of the bits in the same order of the shift code patterns composed of the bits stored in said plural code memories and the mask code patterns stored in said code mask memory.

5. The PN code generator according to claim 2,
wherein said code mask memory also stores the mask code pattern at least one phase following to the phase of the stored mask code pattern.

6. The PN code generator according to claim 2, further comprising:
a distributor inputting every bit stored in the same address of said code memory and retrieves the shift code pattern by superseding the inputted bits, and
wherein said logical AND operation circuit takes a logical AND of the bits in the same order of the shift code pattern retrieved by said distributor and the mask code pattern outputted from said code mask memory.

7. The PN code generator according to claim 2, further comprising:
a shifter inputting every bit stored in the same address of said code memory, and retrieves the shift code pattern by shifting the inputted bits;
wherein said logical AND operation circuit takes a logical AND of the bits in the same order of the shift code pattern retrieved by said shifter and the mask code pattern outputted from said code mask memory.

8. The PN code generator according to claim 2,
wherein plural phase shift circuits constituted by said logical AND operation circuit and said exclusive OR operation circuit, and said plural shifters provided between the plural phase shift circuits and said code memory are included,
wherein said plural shifters input every bit stored in the same address of said code memory, shift the inputted code with a shift amount different by every one bit, and retrieve the plural shift code patterns of which phases are shifted one by one, and
wherein the plural phase shift circuits generate plural PN codes by using the plural shift code patterns, retrieved by the plural shifters, of which phases are shifted one by one and the mask code pattern at the same phase stored in the code mask memory.

9. The PN code generator according to claim 3,
wherein said code memory stores a number of bits corresponding to a degree of the linear feedback shift register, in the same address.

10. The PN code generator according to claim 3,
wherein said code memory stores the number of bits more than the number corresponding to the degree of the linear feedback shift register in the same address, and also, the continuous two or more bits containing either the most significant bit or the least significant bit to be stored in the respective addresses, are stored at adjacent addresses duplicately.

11. The PN code generator according to claim 5,
wherein the plural phase shift circuits constituted by said logical AND operation circuit and said exclusive OR operation circuit are provided, and
wherein the plural phase shift circuits generate the plural PN codes by using the mask code pattern at the continuous phases stored in said code mask memory and the shift code pattern stored in said code memory.

12. A GOLD code generator, comprising:
two PN code generators; and
an exclusive OR operation circuit taking an exclusive OR of two PN codes generated by said two PN code generators, wherein said PN code generator including:
a code memory storing shift code patterns at continuous partial phases among the shift code patterns at plural phases which are given to the respective flip-flops when a linear feedback shift register is operated;
a code mask memory storing mask code patterns, which are partial mask code patterns among the plural mask code patterns to shift a phase of a PN code to be generated, and which shift the phase of the PN code to be generated by a multiple of a stored number of the shift code patterns at the continuous partial phases;
a logical AND operation circuit generating a new code pattern by taking a logical AND of bits in the same order of the shift code pattern stored in said code memory and the mask code pattern stored in said code mask memory; and
a second exclusive OR operation circuit generating the PN code by taking an exclusive OR of the new code pattern generated by said logical AND operation circuit.

13. A GOLD code generator, comprising:
a code memory storing shift code patterns at continuous partial phases among the shift code patterns at plural phases which are given to the respective flip-flops when a liner feedback shift register is operated;
a code mask memory storing mask code patterns, which are partial mask code patterns among the plural mask code patterns to shift a phase of a PN code to be generated, and which shift the phase of the PN code to be generated by a multiple of a stored number of the shift code patterns at the continuous partial phases;
a first and second logical AND circuits generating two new code patterns by taking a logical AND of bits in the same order of the shift code pattern stored in said code memory and the mask code pattern stored in said code mask memory;
a first and second exclusive OR operation circuits generating two PN codes by taking an exclusive OR of the respective two new code patterns generated by said first and second logical AND operation circuits;
a third exclusive OR operation circuit to take the exclusive OR of the two PN codes generated by said first and second exclusive OR operation circuits; and
a control circuit to control the shift code pattern stored in said code memory and the mask code pattern stored in said code mask memory to be outputted to said first and second logical AND operation circuits by time sharing.

14. A PN code despreader, comprising:
a PN code generator generating a PN code; and
an exclusive OR operation circuit despreading a received data by taking an exclusive OR between the PN code generated from the PN code generator and the received data; and
wherein said PN code generator including:
a code memory storing shift code patterns at continuous partial phases among the shift code patterns at plural phases which are given to the respective flip-flops when a liner feedback shift register is operated;
a code mask memory storing mask code patterns, which are partial mask code patterns among the plural mask code patterns to shift a phase of a PN code to be generated, and which shift the phase of the PN code to be generated by a multiple of a stored number of the shift code patterns at the continuous partial phases;
a logical AND operation circuit generating a new code pattern by taking a logical AND of bits in the same order of the shift code pattern stored in the code memory and the mask code pattern stored in the code mask memory; and
a second exclusive OR operation circuit generating the PN code by taking the exclusive OR of the new code pattern generated by the logical AND operation circuit.

15. The PN code despreader according to claim 14, wherein the exclusive OR operation circuits are provided in plural, and further comprising:
a distributor to distribute the PN code generated from said PN code generator to the plural exclusive OR operation circuits by time sharing.

16. The PN code despreader according to claim 14, further comprising:
a distributor to distribute the received data despreaded at the exclusive OR operation circuit by time sharing.

17. A PN code despreader, comprising:
a buffer storing a received data temporary;
a PN code generator generating plural PN codes at the same time; and
a Matched filter despreading the plural PN code generated by said PN code generator and the received data having the same number of bits with the generated PN code,
wherein said PN code generator includes:
a code memory storing shift code patterns at continuous partial phases among the shift code patterns at plural phases which are given to the respective flip-flops when a liner feedback shift register is operated;
a code mask memory storing mask code patterns, which are partial mask code patterns among the plural mask code patterns to shift a phase of a PN code to be generated, and which shift the phase of the PN code to be generated by a multiple of a stored number of the shift code patterns at the continuous partial phases, and to store the mask code pattern at least at one phase following to the above-described phase of the mask code pattern; and
plural phase shift circuits generating the plural PN codes by using the mask code patterns at the continuous phases stored in said code mask memory and the shift code patterns stored in said code memory,
wherein said phase shift circuit includes:
a logical AND operation circuit generating a new code pattern by taking a logical AND of bits in the same order of the shift code pattern stored in said code memory and the mask code pattern stored in said code mask memory; and
an exclusive OR operation circuit generating the PN code by taking an exclusive OR of the new code pattern generated by the logical AND operation circuit.

18. A PN code generator generating a PN code at a random phase, comprising:
a code memory storing a shift code pattern corresponding to a partial phase of the PN code;
a code mask memory storing a mask code pattern corresponding to a phase shift of a partial phase shift amount of the PN code; and
an operation circuit selecting the required shift code patterns from among the shift code patterns corresponding to the partial phases stored in the code memory, and selecting the required mask code patterns from among the mask code patterns of a random phase shift amount corresponding to the partial phases stored in the code mask memory, and thereby, generating the PN code at a random phase by a combination of the selected shift code patterns and the selected mask code patterns from the phase of the PN code to be generated.

* * * * *